United States Patent
Takesue et al.

(10) Patent No.: US 12,012,650 B2
(45) Date of Patent: Jun. 18, 2024

(54) SPUTTERING TARGET AND METHOD OF PRODUCING SPUTTERING TARGET

(71) Applicant: ULVAC, INC., Chigasaki (JP)

(72) Inventors: Kentarou Takesue, Chigasaki (JP);
Masaru Wada, Chigasaki (JP);
Kouichi Matsumoto, Chigasaki (JP);
Yuu Kawagoe, Chigasaki (JP);
Motohide Nishimura, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 191 days.

(21) Appl. No.: 17/597,191

(22) PCT Filed: Apr. 27, 2020

(86) PCT No.: PCT/JP2020/017912
§ 371 (c)(1),
(2) Date: Dec. 28, 2021

(87) PCT Pub. No.: WO2020/261748
PCT Pub. Date: Dec. 30, 2020

(65) Prior Publication Data
US 2022/0307124 A1 Sep. 29, 2022

(30) Foreign Application Priority Data

Jun. 28, 2019 (JP) .................. 2019-120968

(51) Int. Cl.
*C23C 14/34* (2006.01)
*C04B 35/457* (2006.01)
*C23C 14/08* (2006.01)

(52) U.S. Cl.
CPC ........ *C23C 14/3407* (2013.01); *C04B 35/457* (2013.01); *C23C 14/083* (2013.01);
(Continued)

(58) Field of Classification Search
None
See application file for complete search history.

(56) References Cited

U.S. PATENT DOCUMENTS

| 2009/0090914 A1 | 4/2009 | Yano et al. |
| 2010/0129660 A1 | 5/2010 | Nakayama et al. |

(Continued)

FOREIGN PATENT DOCUMENTS

| CN | 102171160 A | 8/2011 |
| CN | 103229303 A | 7/2013 |

(Continued)

OTHER PUBLICATIONS

Office Action dated Oct. 20, 2022 in Taiwanese Application No. 109114967.

(Continued)

*Primary Examiner* — Jason Berman
(74) *Attorney, Agent, or Firm* — Saliwanchik, Lloyd & Eisenschenk

(57) ABSTRACT

[Object] To provide a sputtering target for producing an oxide semiconductor thin film having high properties, which serves as a substitute for IGZO, and a method of producing the same.
[Solving Means] In order to achieve the above-mentioned object, a sputtering target according to an embodiment of the present invention includes: an oxide sintered body including indium, tin, and germanium, in which an atom ratio of germanium with respect to a total of indium, tin, and germanium is 0.07 or more and 0.40 or less, and an atom ratio of tin with respect to the total of indium, tin, and germanium is 0.04 or more and 0.60 or less. As a result, it is possible to achieve transistor characteristics of having mobility of 10 $cm^2$/Vs or more.

10 Claims, 10 Drawing Sheets

(52) U.S. Cl.
CPC .. *C23C 14/3414* (2013.01); *C04B 2235/3286* (2013.01); *C04B 2235/3287* (2013.01); *C04B 2235/3293* (2013.01)

(56) References Cited

U.S. PATENT DOCUMENTS

| | | | |
|---|---|---|---|
| 2011/0163279 A1* | 7/2011 | Ikisawa | C04B 35/457 204/192.15 |
| 2012/0112458 A1 | 5/2012 | Numajiri | |
| 2012/0228133 A1* | 9/2012 | Itose | C04B 35/01 419/38 |
| 2013/0032798 A1 | 2/2013 | Miki et al. | |
| 2013/0087782 A1 | 4/2013 | Yamazaki et al. | |
| 2013/0240802 A1 | 9/2013 | Miki et al. | |
| 2017/0063351 A1 | 3/2017 | Kurokawa | |
| 2019/0288115 A1 | 9/2019 | Goto et al. | |
| 2021/0257465 A1 | 8/2021 | Hanna et al. | |

FOREIGN PATENT DOCUMENTS

| | | | | |
|---|---|---|---|---|
| CN | 109716532 A | | 5/2019 | |
| CN | 112335058 A | | 2/2021 | |
| JP | 2000129431 A | * | 5/2000 | |
| JP | 2001307553 A | * | 11/2001 | |
| JP | 2009-31750 A | | 2/2009 | |
| JP | 2011-216574 A | | 10/2011 | |
| JP | 2012-33854 A | | 2/2012 | |
| JP | 2013-1919 A | | 1/2013 | |
| JP | 2013-70010 A | | 4/2013 | |
| JP | 2013-93561 A | | 5/2013 | |
| JP | 2014-31312 A | | 2/2014 | |
| JP | 2015-30896 A | | 2/2015 | |
| JP | 2017-54502 A | | 3/2017 | |
| KR | 10-2008-0068228 A | | 7/2008 | |
| TW | 200927972 A | | 7/2009 | |
| TW | 201627226 A | | 8/2016 | |
| TW | 201820423 A | | 6/2018 | |
| WO | 2007/058248 A1 | | 5/2007 | |
| WO | 2011/092810 A1 | | 8/2011 | |
| WO | WO-2011093506 A1 | * | 8/2011 | ........... C23C 14/086 |
| WO | 2018/074083 A1 | | 4/2018 | |

OTHER PUBLICATIONS

Office Action dated Aug. 31, 2021 in Japanese Application No. 2020-543832.
Office Action dated Jan. 14, 2021 in Taiwanese Application No. 109114967.
Office Action dated Jun. 16, 2021 in Taiwanese Application No. 109114967.
International Search Report dated Jun. 16, 2020 in International Application No. PCT/JP2020/017912.
Office Action dated Sep. 6, 2023 in Chinese Application No. 202080044257.0.
Office Action dated Feb. 8, 2024 in Korean Application No. 10-2021-7041471.

* cited by examiner

SPUTTERING TARGET AND METHOD OF PRODUCING SPUTTERING TARGET

CROSS-REFERENCE TO RELATED APPLICATIONS

This application is the U.S. national stage application of International Patent Application No. PCT/JP2020/017912, filed Apr. 27, 2020, which claims the benefit under 35 U.S.C. § 119 of Japanese Application No. 2019-120968, filed Jun. 28, 2019, the disclosures of each of which are incorporated herein by reference in their entirety.

TECHNICAL FIELD

The present invention relates to a sputtering target and a method of producing a sputtering target.

BACKGROUND ART

A thin film transistor (TFT) using an In—Ga—Zn—O oxide semiconductor film (IGZO) for an active layer has been widely applied to various displays (see, for example, Patent Literatures 1 to 3) because higher mobility as compared with the existing TFT using an amorphous silicon film for an active layer can be achieved.

For example, Patent Literature 1 discloses an organic EL display device in which an active layer of a TFT driving an organic EL device is formed of IGZO. Patent Literature 2 discloses a thin film transistor in which a channel layer (active layer) is formed of a-IGZO, the thin film transistor having the mobility of 5 cm$^2$/Vs or more. Patent Literature 3 discloses a thin film transistor in which an active layer is formed of IGZO, the thin film transistor having an on/off current ratio of 5 digits or more.

CITATION LIST

Patent Literature

Patent Literature 1: Japanese Patent Application Laid-open No. 2009-31750
Patent Literature 2: Japanese Patent Application Laid-open No. 2011-216574
Patent Literature 3: WO2010/092810

DISCLOSURE OF INVENTION

Technical Problem

In recent years, there has been an increasing demand for an oxide semiconductor exhibiting higher mobility from the demand for higher resolution, lower power consumption, and higher frame rate in various displays. However, in the thin film transistor using IGZO for an active layer, it is difficult to achieve mobility exceeding 10 cm$^2$/Vs, and it is desired to develop a material for applications to a thin film transistor exhibiting higher mobility.

In view of the circumstances as described above, it is an object of the present invention to provide an oxide semiconductor thin film having high properties, which serves as a substitute for IGZO.

Solution to Problem

In order to achieve the above-mentioned object, a sputtering target according to an embodiment of the present invention includes: an oxide sintered body including indium, tin, and germanium, in which an atom ratio of germanium with respect to a total of indium, tin, and germanium is 0.07 or more and 0.40 or less, and an atom ratio of tin with respect to the total of indium, tin, and germanium is 0.04 or more and 0.60 or less.

As a result, it is possible to achieve transistor characteristics of having mobility of 10 cm$^2$/Vs or more.

By setting the atom ratio of Ge/(In+Sn+Ge) to 0.07 or more, it is possible to obtain an amorphous oxide semiconductor thin film independent of the content of Sn.

By setting the atom ratio of Sn/(In+Sn+Ge) to 0.04 or more, it is possible to obtain an oxide semiconductor thin film having a carrier density of $5\times10^{19}$ or less.

By setting the atom ratio of Sn/(In+Sn+Ge) to 0.60 or less, it is possible to obtain an oxide semiconductor thin film having mobility of 10 or more independent of the content of Ge.

In the sputtering target, an atom ratio of indium with respect to the total of indium, tin, and germanium may be 0.3 or more, and the atom ratio of germanium with respect to the total of indium, tin, and germanium may be 0.10 or more and 0.25 or less.

As a result, it is possible to obtain an amorphous oxide semiconductor thin film independent of the content of Sn.

In the sputtering target, the oxide sintered body may further include a first element that is at least one element selected from the group consisting of Si, Ti, Mg, Ca, Ba, Zr, Al, W, Ta, Hf, and B.

In the sputtering target, an atom ratio of the first element with respect to a total of indium, tin, germanium, and the first element may be 0.10 or less.

In the sputtering target, the oxide sintered body may further include a second element that is at least one element selected from the group consisting of Sr, Ga, and Zn.

In the sputtering target, an atom ratio of the second element with respect to a total of indium, tin, germanium, and the second element may be 0.25 or less, the second element being β.

In sputtering target, a relative density may be 97% or more.

In the sputtering target, a specific resistance value may be 0.1 mΩ·cm or more and 10 mΩ·cm or less.

In the sputtering target, a specific resistance value in a thickness direction may fall within a range of 0.8 or more and 1.2 or less with respect to an average value of the bulk specific resistance value.

In the sputtering target, the oxide sintered body may have at least one compound phase of an In—O phase, an In—Sn—O phase, and an In—Ge—O phase.

In order to achieve the above-mentioned object, in a method of producing a sputtering target according to an embodiment of the present invention, an indium oxide powder, a tin oxide powder, and a germanium oxide powder are mixed to form a molded body, and the molded body is sintered in an oxygen atmosphere of 1500° C. or more and 1600° C. or less to produce a sputtering target including an oxide sintered body.

Advantageous Effects of Invention

As described above, in accordance with the present invention, there is provided an oxide semiconductor thin film having high properties, which serves as a substitute for IGZO.

MODE(S) FOR CARRYING OUT THE INVENTION

Hereinafter, an embodiment of the present invention will be described with reference to the drawings. In each drawing, XYZ-axis coordinates are introduced in some cases. Further, the same members or members having the same function are denoted by the same reference symbols, and the description thereof is omitted as appropriate in some cases after the corresponding member is described.

First, before describing a sputtering target(oxide semiconductor sputtering target) according to this embodiment, the properties of an oxide semiconductor film formed using this sputtering target will be described.

Oxide Semiconductor Thin Film

An oxide semiconductor film is used for, for example, an active layer (inverted layer) in a thin film transistor such as a so-called bottom gate type electric field effect transistor.

Typical examples of an oxide semiconductor material of high mobility generally include an ITO (In—Sn—O) material and an IGZO (In—Ga—Zn—O) material. Since the crystallinity of each of these oxide semiconductor materials immediately after deposition is amorphous, patterning can be easily performed by a wet etching method. After the patterning, heat treatment is performed for activation, thereby expressing desired transistor characteristics.

In general, an oxide of high mobility has a problem that it is difficult to suppress the fluctuation of a gate threshold value voltage to a predetermined value or less as the mobility increases, so that it is difficult to achieve a switching operation with high reliability over a long time. Since oxygen deficiency is a cause of these problems, adding, as a carrier killer, a small amount of a material having a strong bond with oxygen, such as Hf (hafnium), Ti (titanium), and W (tungsten), is widely performed. However, in order to achieve the desired reliability, there is a need to add a sufficient amount of these elements, and addition of a large amount of the carrier killer element leads to a decrease in mobility.

Meanwhile, it has been found that by adding a predetermined amount or more of Ge having a high effect as a carrier killer and a low reduction rate of mobility to In serving as a base, both mobility and reliability are improved as compared with the existing ITO material and IGZO material.

Figure 1:
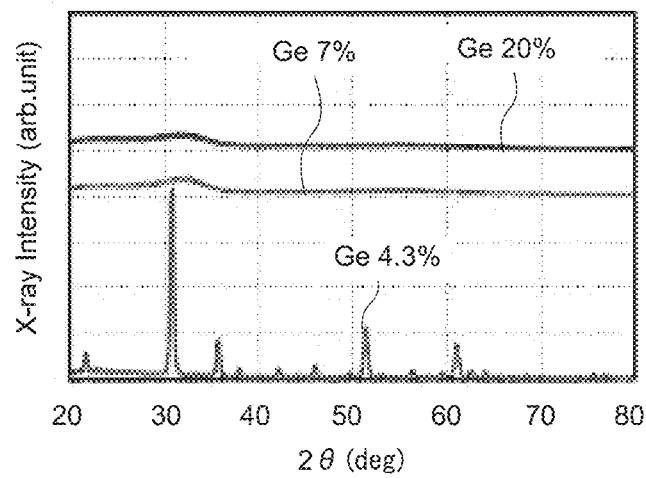
FIG. 1 is a graph diagram showing experimental results of evaluating the content (at %) of Ge in an In—Ge—O material deposited by a sputtering method and the crystallinity of an obtained thin film.

For example, FIG. 1 shows experimental results of evaluating the content (at %) of Ge in an In—Ge—O material deposited by a sputtering method and the crystallinity of an obtained thin film.

Here, a thin film sample annealed for 1 hour at 350° C. in the atmosphere after deposition was evaluated. As shown in the figure, a sample having the Ge content of 4.3 at % is crystalline while samples having the Ge content of 7% and 20% are amorphous.

Figure 2:
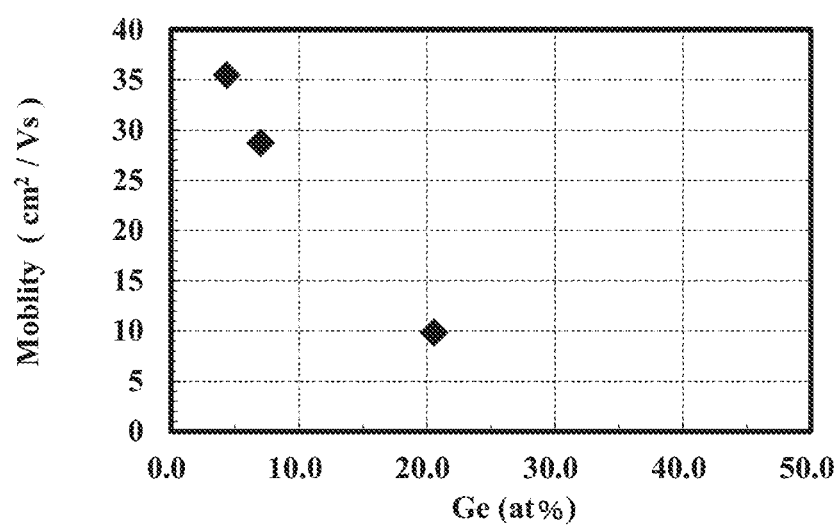
FIG. 2 is a graph diagram showing measurement results of mobility of each sample by a Hall effect measuring device.
Figure 3:
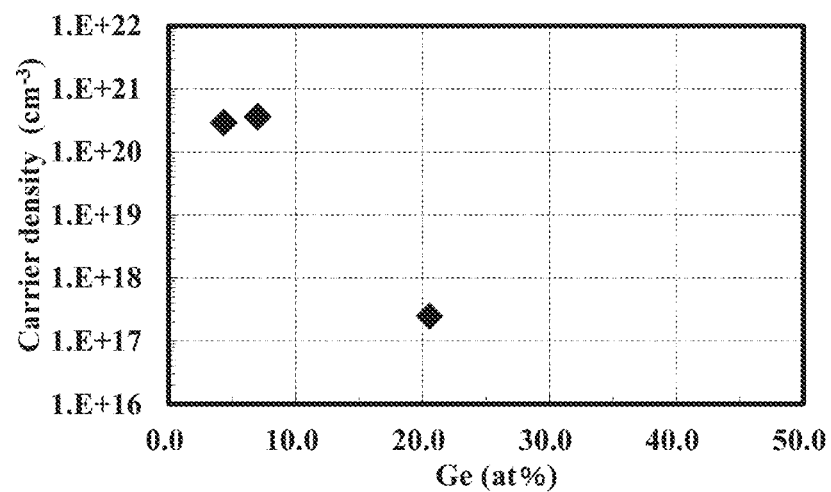
FIG. 3 is a graph diagram showing measurement results of a carrier density of each sample by a Hall effect measuring device.

Meanwhile, FIG. 2 and FIG. 3 respectively show measurement results of the mobility and the carrier density of the samples described above by a Hall effect measuring device.

As shown in FIG. 2, the mobility tends to decrease as the Ge content increases. As shown in FIG. 3, the samples having the Ge content of 4.3 at % and 11 at % show a high value of $1\times10^{20}$ (/cm$^3$) while the value of the sample having the Ge content of 20 at % is reduced to $1\times10^{18}$ (/cm$^3$) or less. The suitable range of the carrier density is generally on the order of $10^{18}$ to $10^{19}$ (/cm$^3$). The decrease in mobility becomes remarkable when the carrier density is less than $1\times10^{18}$ (/cm$^3$) and the decrease in the reliability of the switching operation becomes remarkable when the carrier density exceeds $1\times10^{20}$ (/cm$^3$).

From the results shown in FIG. 1 to FIG. 3, it was confirmed that by setting the Ge content to 7 at % or more, an amorphous oxide thin film could be obtained and a sufficient effect as a carrier Killer could be achieved.

Subsequently, the Sn-concentration dependency of the crystallinity and the Sn-concentration dependency of the mobility in an In—Sn—Ge—O material are respectively shown in FIG. 4 and FIG. 5. A Hall effect measuring device was used to measure the mobility. Here, the Ge content was fixed to 12 at %, and thin film samples annealed for 1 hour at 350° C. ("♦" in FIG. 5) and 400° C. ("◇" in FIG. 5) in the atmosphere after deposition were evaluated.

Figure 4:
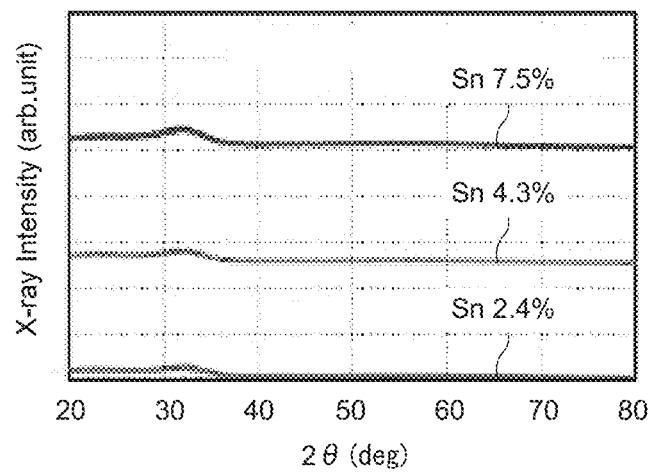
FIG. 4 is a graph diagram showing the Sn-concentration dependency of the crystallinity in an In—Sn—Ge—O material.
Figure 5:
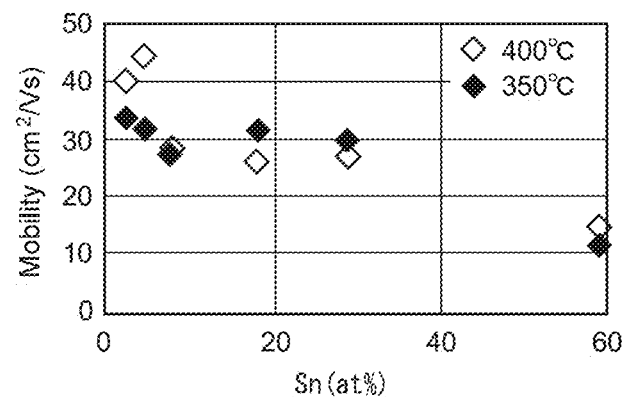
FIG. 5 is a graph diagram showing the Sn-concentration dependency of mobility in an In—Sn—Ge—O material.

As shown in FIG. 4, the samples having the Sn content of 2.4 at %, 4.3 at %, and 7.5 at % were amorphous. From this fact, an In—Sn—Ge—O oxide thin film deposited by a sputtering method is presumed to be amorphous independent of the Sn content. Meanwhile, as shown in FIG. 5, a remarkable decrease in mobility was not recognized (generally, around 30 cm$^2$/Vs) when the Sn content was up to 30 at %, and the mobility of 10 cm²/Vs or more could be achieved even in the case where the Sn content was increased to 60 at %.

Figure 6:
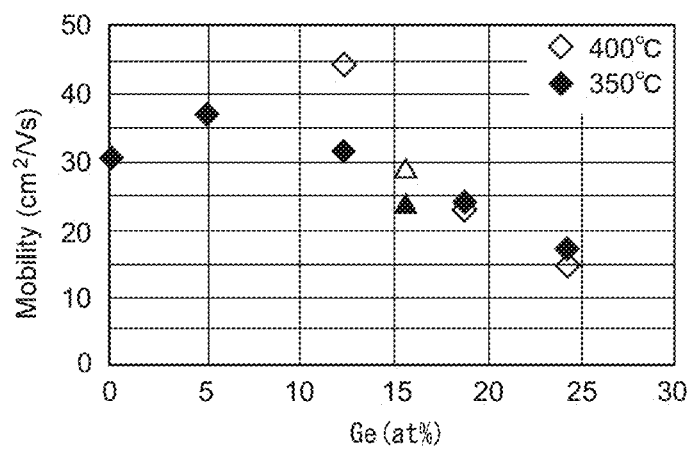
FIG. 6 is a graph diagram showing the Ge-concentration dependency of mobility in an In—Sn—Ge—O material deposited with the Sn content fixed at 5 at %.
Figure 7:
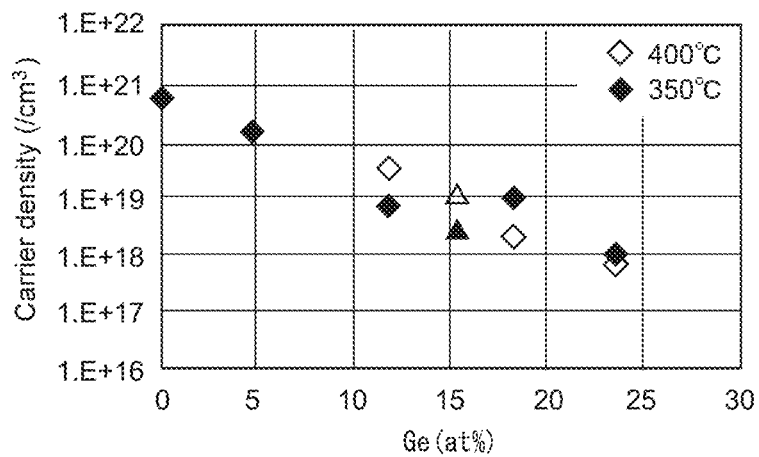
FIG. 7 is a graph diagram showing the Ge-concentration dependency of a carrier density in an In—Sn—Ge—O material deposited with the Sn content fixed at 5 at %.

Next, the Ge-concentration dependency of the mobility and the Ge-concentration dependency of the carrier density in the In—Sn—Ge—O material deposited with the Sn content fixed at 5 at % are respectively shown in FIG. 6 and FIG. 7. A Hall effect measuring device was used to measure the mobility and the carrier density. Here, a ternary sputtering method in which three targets of indium oxide, germanium oxide, and tin oxide are simultaneously sputtered in an oxygen atmosphere was adopted. Thin film samples annealed for 1 hour in the atmosphere at 350° C. ("♦" in each figure) and 400° C. ("◊" in each figure) after deposition were evaluated.

As shown in FIG. 6, the mobility was confirmed to be 10 cm²/Vs or more in all samples. Further, As shown in FIG. 6 and FIG. 7, the mobility was configured to be 15 cm²/Vs or more and the carrier density was $1 \times 10^{18}$ to $1 \times 10^{19}$ (/cm³) in the case where the Ge content was in the range of 10 to 25 at %.

Note that although the evaluation results shown in FIG. 6 and FIG. 7 are those of the samples deposited by ternary sputtering, the measured mobility and the measured carrier density of a sample deposited using an In—Sn—Ge—O sintered body target with the Ge content of 15 at % (Sn content of 5 at %) are also shown in FIG. 6 and FIG. 7, respectively. In each figure, "▲" and "△" respectively represent thin film samples annealed for 1 hour at 350° C. in the atmosphere and 400° C. in the atmosphere. As shown in FIG. 6 and FIG. 7, also the sintered body target was confirmed to show the same electrical property as that of the sample deposited by a ternary sputtering method and have the mobility of approximately 20 to 30 cm²/Vs and the carrier density of approximately $5 \times 10^{18}$ to $1 \times 10^{19}$ (/cm³).

Figure 8:
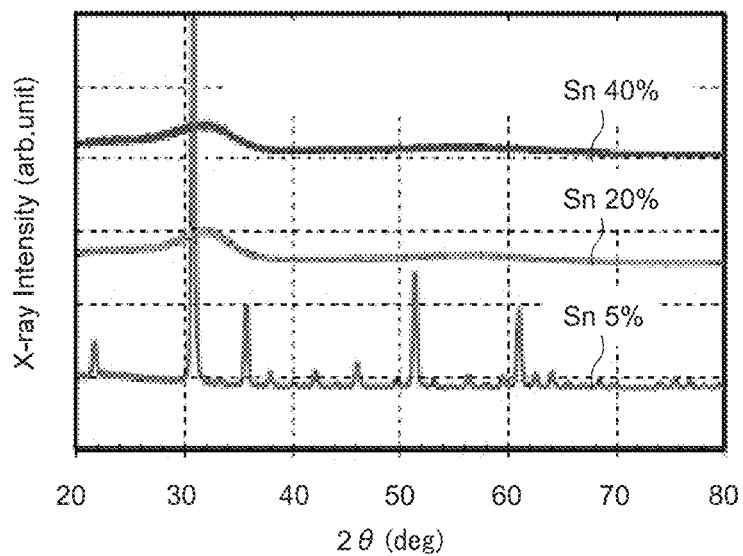
FIG. 8 is a graph diagram showing results of evaluating the crystallinity of thin films when the Ge content was fixed at 5 at % and the Sn content was set to 5 at %, 20 at %, and 40 at %.

Meanwhile, although an amorphous thin film could be obtained in the case where the Ge content was 12 at % or more as described above, an amorphous thin film can be obtained also by increasing the Sn content instead of Ge content because an amorphous thin film cannot not be obtained in the case where the Ge content was 7 at %. FIG. 8 shows the results of evaluating the crystallinity of thin films when the Ge content was fixed at 5 at % and the Sn content was set to 5 at %, 20 at %, and 40 at %. Here, thin film samples annealed for 1 hour at 350° C. in the atmosphere after deposition were evaluated. As shown in the figure, by setting the Sn content to 20 at % or more, an amorphous In—Sn—Ge—O thin film can be obtained.

Sputtering Target

Next, a sputtering target according to this embodiment will be described.

The sputtering target may be a planar target or a cylindrical rotary target. The sputtering target includes an oxide semiconductor thin film containing In, Sn, and Ge. When the total of In, Sn, and Ge is represented by In+Sn+Ge, the atom ratio of Ge/(In+Sn+Ge) is 0.07 or more and 0.4 or less. Note that the upper limit value and the lower limit value of the composition are values rounded off to two decimal places (the same applies hereinafter).

By forming the sputtering target of the In—Sn—Ge—O oxide semiconductor thin film within the composition range described above, transistor characteristics of having mobility of 10 cm²/Vs or more can be achieved.

As a sputtering target, since an amorphous In—Sn—Ge—O oxide semiconductor thin film can be obtained by setting the atom ratio of Sn/(In+Sn+Ge) to 0.04 or more and 0.60 or less, the total of In, Sn, and Ge being represented by In+Sn+Ge, an oxide semiconductor can be easily patterned using, for example, an oxalic acid etchant.

By setting the atom ratio of Sn with respect to the total of In, Sn, and Ge to 0.04 or more, an oxide semiconductor thin film having the carrier density of $5 \times 10^{19}$ (/cm³) or less can be obtained. By setting the atom ratio of Sn with respect to the total of In, Sn, and Ge to 0.60 or less, an oxide semiconductor thin film having mobility of 10 cm²/Vs or more can be obtained independent of the content of Ge.

Further, when the active layer includes an oxide semiconductor thin film containing Sn, the chemical resistance of the active layer can be increased. This eliminates the necessity to provide an etching stopper layer for protecting the active layer from an etchant during the patterning process of a source/drain electrode of the thin film transistor. As a result, after forming a metal layer having the active layer as a base film, the metal layer is patterned by a wet etching method, thereby making it possible to easily form a source/drain electrode.

As the etchant, an oxalic acid etchant (oxalic acid 95%) can be typically used, and examples thereof include ITO-06N (KANTO CHEMICAL CO., INC.).

In the oxide semiconductor thin film constituting a sputtering target, the atom ratio of Ge/(In+Sn+Ge) is favorably 0.07 or more and 0.40 or less, and more favorably 0.10 or more and 0.25 or less. As a result, it is possible to obtain an amorphous oxide semiconductor thin film independent of the content of Sn. Further, by setting the Ge content to the range described above, it is possible to achieve both high mobility of 15 to 35 cm²/Vs and carrier density of $10^{19}$ (/cm³) order or less in the case where the atom ratio of In/(In+Sn+Ge) is 0.3 or more.

The sputtering target may further contain a first element (α) that is at least one element selected from the group consisting of Si (silicon), Ti (titanium), Mg (magnesium), Ca (calcium), Ba (barium), Zr (zirconium), Al (aluminum), W (tungsten), Ta (tantalum), Hf (hafnium), and B (boron). Each of these first elements (α) is an element serving as a carrier killer of the active layer, and contributes to the reduction of carrier density in the thin film, thereby making it possible to improve the reliability of a switching operation of the thin film transistor.

The amount of the first element (α) to be added is not particularly limited. For example, the atom ratio of α/(In+Sn+Ge+α) is 0.10 or less when the total of In, Sn, Ge, and α is represented by In+Sn+Ge+α. As a result, it is possible to reliably achieve high mobility of 10 cm²/Vs or more while reducing the carrier density to $10^{18}$ (/cm³) order or less.

Alternatively, the sputtering target may further contain a second element (β) that is at least one element selected from the group consisting of Sr (strontium), Ga (gallium), and Zn (zinc). Although each of these second elements (β) does not have sufficient performance as a carrier killer, it is an additive element with less reduction of mobility, and contributes to improvement of crystallinity and reduction of the carrier density in a thin film, thereby making it possible to improve the reliability of a switching operation.

The amount of the second element (β) to be added it not particularly limited. For example, the atom ratio of β/(In+Sn+Ge+β) is 0.25 or less when the total of In, Sn, Ge, and β is represented by In+Sn+Ge+β. As a result, it is possible to reliably achieve high mobility of 10 cm²/Vs or more while reducing the carrier density to $10^{18}$ (/cm³) order or less.

Further, the relative density of the sputtering target with respect to the theoretical density is 97% or more. The bulk specific resistance value of the sputtering target is 0.1 mΩ·cm or more and 10 mΩ·cm or less. The bulk specific resistance value of the sputtering target in the thickness direction falls within the range of 0.8 or more and 1.2 or less with respect to the average value of the bulk specific resistance value. In the sputtering target, the oxide sintered body has at least one compound phase of an In—O phase, an In—Sn—O phase, and an In—Ge—O phase.

In the thin film transistor formed using the sputtering target, since the fluctuation of a threshold value voltage can be suppressed to a predetermined voltage or less, it is possible to achieve a switching operation with high reliability over a long time. For example, in a BTS test in which a constant voltage is continuously applied between a gate electrode-source electrode (or a gate electrode-source electrode and a drain electrode-source electrode) and the fluctuation of the threshold value voltage at that time is evaluated, favorable results are achieved for both PBTS (Positive Bias Temperature Stress) and NBTS (Negative Bias Temperature Stress).

Specifically, the amount of change in the threshold value voltage before and after the PBTS test in which a gate voltage of +30 V is applied for 60 minutes at a temperature of 60° C. was 0 V or more and 1 V or less. Further, the amount of change in the threshold value voltage before and after the NBTS test in which a gate voltage of −30 V is applied for 60 minutes at a temperature of 60° C. was −1 V or more and 0 V or less.

The active layer is formed by depositing a sputtering target including a sintered body formed of respective oxides of In, Sn, and Ge and then performing heat treatment on (annealing) them at a predetermined temperature. By sputtering the target described above under predetermined conditions, an oxide semiconductor thin film having the same or substantially the same composition as the composition of the target is formed. By annealing this semiconductor thin film at a predetermined temperature, for example, an active layer having transistor characteristics of having mobility of 10 cm$^2$/Vs or more is formed.

Production of Sputtering Target

The sputtering target includes a sintered body obtained by using, as raw material powders, respective oxides of In, Sn, and Ge such as $In_2O_3$, $SnO_2$, and $GeO_2$ and mixing them at the composition ratio described above.

The oxide sintered body included in the sputtering target is formed by mixing an $In_2O_3$ powder, an $SnO_2$ powder, and a $GeO_2$ powder to form a molded body and sintering the molded body in an oxygen atmosphere of 1500° C. or more and 1600° C. or less.

In this embodiment, a raw material powder is granulated in a spray-drying method capable of performing drying and granulation at once. Thanks to the fact that a pulverization operation having poor pulverizability becomes unnecessary by adding a binder, a spherical powder having good fluidity can be used, and the like, the composition distribution of the sputtering target easily becomes uniform.

The raw material powder includes at least an indium oxide powder, a tin oxide powder, and a germanium oxide powder. In addition thereto, one or more powders selected from the group consisting of a silicon oxide powder, a titanium oxide powder, a magnesium oxide powder, a calcium oxide powder, a barium oxide powder, a zirconium oxide powder, an aluminum oxide powder, a tungsten oxide powder, a tantalum oxide powder, a hafnium oxide powder, a boron oxide powder, a strontium oxide powder, a gallium oxide powder, a zinc oxide powder, and the like may be mixed.

The average particle diameter of a granulated powder is set to 500 μm or less. When the average particle diameter of a granulated powder exceeds 500 μm, occurrence of cracks of the molded body is remarkable and granular spots are generated on the surface of a fired body. When such a fired body is used for a target for sputtering, there is a possibility that abnormal discharge occurs or particles are generated.

A more favorable average particle diameter of the granulated powder is 20 μm or more and 100 μm or less. As a result, the change in volume (compressibility) before and after CIP (Cold Isostatic Press) molding is small, occurrence of cracks of the molded body is suppressed, and a long molded body can be stably prepared. Note that in the case where the average particle diameter is less than 20 μm, the powder tends to scatter, which makes it difficult to handle.

Here, the "average particle diameter" means a value in which the accumulated % of the particle size distribution measured by a sieving particle size distribution measurement device is 50%. Further, as the value of the average particle diameter, a value measured by "Robot Sifter RPS-105M" manufactured by SEISHIN ENTERPRISE Co., Ltd.

The granulated powder is molded at a pressure equal to or higher than 100 MPa/cm$^2$. As a result, a sintered body having the relative density of 97% or more can be obtained. In the case where the molding pressure is less than 100 MPa, the molded body is fragile and is difficult to handle, and the relative density of the sintered body is reduced.

As a molding method, a CIP method is employed. The form of CIP may be a vertical method of a typical vertical load type and may be favorably a horizontal method of a horizontal load type. This is because when a molded body of a long plate shape is prepared by vertical type CIP, variations in thickness occurs due to a deviation of the powder in the mold or the molded cracks due to self-weight during handling.

The molded body of the powder is fired at a temperature of 1500° C. or more and 1600° C. or less. In the case where the firing temperature is less than 1500° C., the conductivity and the relative density are reduced, making it unsuitable for target applications. Meanwhile, when the firing temperature exceeds 1600° C., evaporation of some components occurs, composition deviation of the fired body occurs, or the strength of the fired body is reduced due to the coarsening of the crystal grains.

The molded body is fired in the atmosphere or an oxidizing atmosphere. As a result, a target oxide sintered body is stably produced.

For the preparation of the granulated powder, a powder in which the average particle diameters of primary particles are 0.3 μm or more and 1.5 μm or less is used. As a result, it is possible to shorten the mixing and pulverizing time, and the dispersibility of the raw material powder in the granulated powder is improved.

The angle of repose of the granulated powder is favorably 32° or less. As a result, the fluidity of the granulated powder is increased, and the molding property and the sintering property are improved.

A specific production method will be described using a flowchart.

Figure 9:
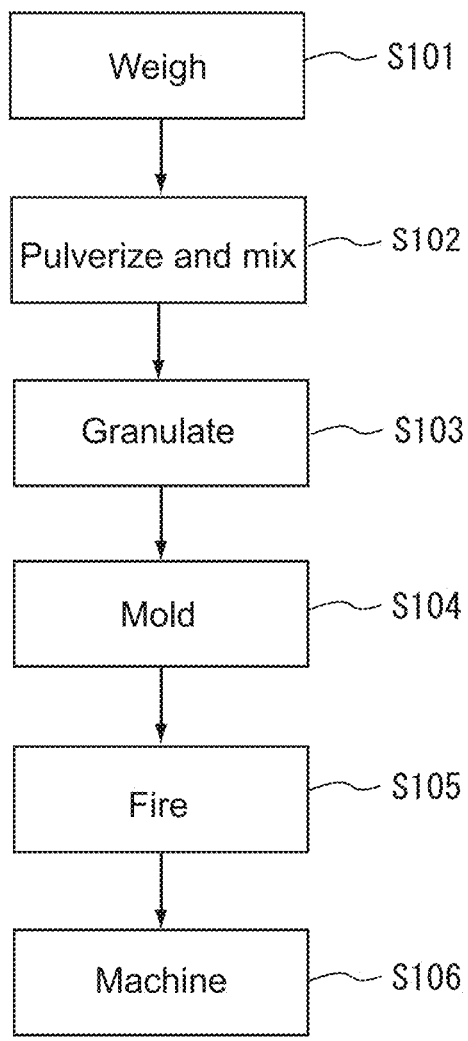
FIG. 9 is a flowchart showing a production process of a sputtering target according to this embodiment.

FIG. 9 is a flowchart showing a production process of a sputtering target according to this embodiment. The production method is not limited to this method.

The method of producing a sputtering target includes a weighing step (Step 101), pulverizing/mixing step (Step 102), a granulating step (Step 103), a molding step (Step 104), a firing step (Step 105), and a processing step (Step 106).

(Weighing, Pulverizing/Mixing Step)

As the raw material powder, an indium oxide powder, a tin oxide powder, and a germanium oxide powder are used. These respective powders are weighed, pulverized by a ball mill or the like, and mixed, and thus, slurry wet-grinded by water or the like is produced (Steps 101 and 102).

As the raw material powder, for example, those in which the average particle diameters of primary particles are adjusted to 0.3 μm or more and 1.5 μm or less are used. As a result, it is possible to perform the pulverizing/mixing step in a relatively short time. Further, the dispersibility of each oxide particle in the obtained granulated powder is improved.

The mixing ratio of each of the raw material powders is appropriately set in accordance with the condition for performing sputtering and applications of a film to be deposited. For example, in addition to the respective raw material powders described above, at least one or more metal oxide powders selected from the group consisting of a silicon oxide powder, a titanium oxide powder, a magnesium oxide powder, a calcium oxide powder, a barium oxide powder, a zirconium oxide powder, an aluminum oxide powder, a tungsten oxide powder, a tantalum oxide powder, a hafnium oxide powder, a boron oxide powder, a strontium oxide powder, a gallium oxide powder, a zinc oxide powder, and the like may be mixed. Further, for mixing the raw material powder, a binder, a dispersing agent, or the like may be added.

As the pulverizing/mixing method of the raw material powder, in addition to a ball mill, for example, another medium stirring mill such as a bead mill and a rod mill can be used. Resin-coating or the like may be applied to the surface of a ball or bead serving as a stirring medium. As a result, mixing of an impurity into the powder is effectively suppressed.

(Granulating Step)

By drying and classing the slurry, the raw material powder is granulated (Step 103). The granulation is performed for the purpose of fixing the ratio of the formulation component, improving the handling property of the raw material powder, and the like. By granulating, it is possible to adjust the bulk density, the tapped density, and the angle of repose of the powder, and occurrence of cracks of the molded body is suppressed during CIP molding of a long target.

The granulating method is not particularly method, and it is possible to directly dry the slurry using a spray dryer or the like for granulating. Further, a dry granulation method without using slurry is also applicable.

The granulated powder is prepared such that the average particle diameter of a granulated powder is 500 μm or less, favorably 20 μm or more and 100 μm or less. As a result, a relatively long molded body is stably prepared. When the average particle diameter of the granulated powder exceeds 500 μm, granular spots are generated on the surface of a fired body. When such a fired body is used for a target for sputtering, there is a possibility that abnormal discharge occurs or particles are generated.

It is favorable that the granulated powder has higher fluidity. For example, the raw material powder is granulated such that the angle of repose is 32° or less. As a result, the fluidity of the granulated powder is increased, and the molding property and the firing property are improved. In the case where the angle of repose is large, cracks tend to occur in the molded body in the molding step (CIP), and uneven colors tend to occur in the fired body in the firing step.

The angle of repose of the granulated powder is suppressed as follows. For example, in the case where slurry is dried, and pulverized and classified by a roll mill as a granulation method, the angle of repose is controlled by the treatment time and the number of times of treatment of the powder by the roll mill. Meanwhile, in the case where the slurry is directly dried using a spray dryer or the like as a granulation method, the angle of repose is controlled by the slurry concentration, the viscosity, the condition of the spray dryer, or the like.

The bulk density of the granulated powder is controlled as follows. For example, in the case where slurry is dried, and pulverized and classified by a roll mill as a granulating method, the bulk density is controlled by pulverizing and classifying, by a roll mill, those obtained by compressing a dried body by a press. Meanwhile, in the case where the slurry is directly dried using a spray dryer or the like as a granulation method, the bulk density is controlled by the slurry concentration, the viscosity, the condition of the spray dryer, or the like.

(Molding Step)

In the molding step, the granulated powder is molded into a predetermined shape (Step 104). Typically, the granulated powder is molded into a rectangular plate shape from which a desired long target is obtained. As the molding method, typically, a CIP method is employed. In addition thereto, a mold pressing method or the like may be employed.

The molding pressure is set to 100 $MPa/cm^2$ or more. In the case where the molding pressure is less than 100 $MPa/cm^2$, the molded body is fragile and difficult to handle, and the relative density of the sintered body tends to decrease. Meanwhile, by setting the molding pressure to 100 $MPa/cm^2$ or more, a sintered body having the relative density of 97% or more can be obtained.

The molding can be one of CIP and mold pressing as long as the pressure of 100 $MPa/cm^2$ or more can be achieved. When the area of a mold increases, the press shaft diameter and the pressure limits the molding pressure in the case of a metal mold.

A typical structure of CIP is a vertical load type (hereinafter, referred to as the vertical CIP) in which a pressure container for storing a pressure medium is disposed in a vertical shape. In the case of the vertical CIP, there is a need to make the granulated powder vertical in order to insert the granulated powder into a mold and into a pressure container. Since the granulated powder to be used has high fluidity, the granulated powder shifts to the lower side of the mold under the influence of gravity in the case where it is made vertical. When pressing is performed in this condition, an obtained molded body has a large unevenness in the thickness between the upper and lower portions, which leads to a decrease in yield of products. When CIP molding is performed in the vertical state, warpage is likely to occur due to the nature of isotropic pressure pressing. In the case of a molded body exceeding 2000 mm, this warpage causes cracking in handling or the like in a later step.

Meanwhile, in the case of the horizontal load type (hereinafter, referred to as the horizontal CIP), since gravity acts in the thickness direction, no deviation of the granulated powder occurs. Further, since a gravitational force acts downward during molding, no warpage occurs in the molded body.

(Firing Step)

In the firing step, a molded body of a granulated powder is fired at a temperature of 1500° C. or more and 1600° C. or less (Step 105). In the case where the firing temperature is less than 1500° C., both the conductivity and the relative density are low, making it unsuitable for target applications. Meanwhile, in the case where the firing temperature exceeds 1600° C., any component seriously evaporates, and the compositional deviation of the fired body easily occurs. Further, the coarsening of the crystal grains leads to a decrease in the strength of the fired body in some cases. By setting the firing temperature to 1500° C. or more and 1600° C. or less, a fired body having high density (relative density of 97% or more) can be stably prepared.

The firing time (holding time at the firing temperature) is not particularly limited, and is set to, for example, 2 hours or more and 20 hours or less. As a result, it is possible to obtain a fired body for an oxide sputtering target having the relative density of 97% or more.

The atmosphere in the furnace at the time of firing is the atmosphere or an oxidizing atmosphere. As a result, a target oxide sintered body is stably produced. The pressure at the time of firing is, for example, normal pressure. When a molded body is fired at normal pressure, a fired body having a specific resistance of 0.1 to 10 mΩ·cm can be obtained. Note that the specific resistance of a fired body tends to decrease as the firing temperature is higher. In order to ensure relatively high conductivity, the firing temperature is favorably higher.

Note that in the case where the inside of the firing furnace is in a reducing atmosphere, oxygen-deficiency occurs in the fired body and the fired body tends to have properties closer to metal than an oxide. Further, when firing is performed in a nitrogen or argon atmosphere, there is a concern that the relative density does not increase.

(Machining Step)

The fired body prepared as described above is machined into a plate shape of a desired shape, a size, and a thickness, and thus, a sputtering target formed of an In—Sn—Ge—O sintered body is prepared (Step 106). The sputtering target is integrated into a backing plate by brazing.

In accordance with this embodiment, it is possible to prepare a long sputtering target having the length of 1000 mm in the longitudinal direction. As a result, a large-sized sputtering target that does not have a split structure can be prepared, and thus, it is possible to inhibit the film properties from deteriorating, which may occur due to sputtering of the bonding material (brazing material) penetrated into a gap (seam) of the divided portion, and perform stable deposition. Further, particles caused by reattachment (redeposition) of sputtered particles deposited in the gap are less likely to be generated.

Note that the weighing and pulverizing/mixing steps, dispersibility in the slurry differs in some cases due to the crystallinity regarding a GeO$_2$ powder of the raw material powders.

For example, of the GeO$_2$ crystals, a tetragonal GeO$_2$ crystal has a property of being insoluble in water, similarly to In$_2$O$_3$ and SnO$_2$. Meanwhile, the hexagonal GeO$_2$ crystal has a property of being soluble in water. Therefore, during wet grinding, by dissolving the hexagonal GeO$_2$ powder in a solvent (e.g., pure water), it is possible to improve the dispersibility of the GeO$_2$ component in the slurry during wet grinding.

As a result, slurry in which the GeO$_2$ powder is favorably dispersed in a solvent is obtained. By drying and granulating this slurry, variations in the GeO$_2$ component are suppressed in the sintered body, variations in the specific resistance in the thickness direction are suppressed, and it is possible to increase the density of the sintered body and densify the particle diameter of the sintered body.

For example, by appropriately adjusting the mixing ratio of the hexagonal crystal and the tetragonal crystal of the GeO$_2$ powder used during wet grinding, local segregation of the GeO$_2$ component in the sintered body is less likely to occur. As a result, variations in the specific resistance of the sintered body in the thickness direction are suppressed.

Further, since the dispersibility in wet grinding is improved, excessive high-temperature treatment is not required to increase the density of the sintered body and the coarsening of the crystal grains in the sintered body is suppressed.

For example, in this embodiment, as an example, the mixing ratio of the hexagonal crystal and the tetragonal crystal in the GeO$_2$ crystals is appropriately adjusted using X-ray diffraction. For example, as the GeO$_2$ powder, a GeO$_2$ powder in which the intensity ratio (the tetragonal crystal/the hexagonal crystal) between the main peak of the hexagonal crystal (2θ: near 25.91°, (101) plane) and the main peak of the tetragonal crystal (2θ: near 25.24°, (110) plane) is adjusted to 0.15 or less is used. Here, the intensity ratio is a ratio of a peak height.

Examples of devices used in X-ray diffraction and measurement conditions are as follows.

X-ray diffraction device: RINT manufactured by Rigaku Corporation and its Global Subsidiaries
Scanning method: 2θ/θ method
Target: Cu
Tube voltage: 40 kV
Tube current: 20 mA
Scan speed: 2.000°/min
Sampling width: 0.050°
Divergence slit: 1°
Scattering slit: 1°
Receiving slit: 0.3 mm Evaluation of Sputtering Target (Specific Resistance Value Distribution)

Figure 10:
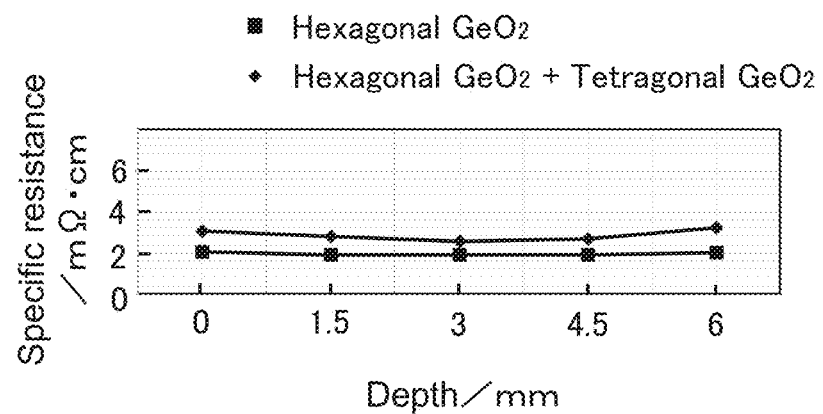
FIG. 10 is a graph diagram showing the distribution of a specific resistance value in the depth direction of the sputtering target.

FIG. 10 is a graph diagram showing the distribution of a specific resistance value in the depth direction of the sputtering target.

An oxide target having a specific resistance value (bulk specific resistance) that is uniform in the depth direction (thickness direction) from the sputtering target surface can be produced within the range used as a product by adjusting the firing atmosphere and the firing conditions. Since the specific resistance value is uniform in the depth direction, a film having the same quality is formed from the beginning to the end of deposition. For example, the bulk specific resistance value in the thickness direction falls within the range of 0.8 or more and 1.2 or less with respect to the average value of the bulk specific resistance value.

Here, as a germanium oxide powder of the raw material powders, a mixed powder of germanium oxide (GeO$_2$) having a hexagonal crystal and germanium oxide (GeO$_2$) having a tetragonal crystal may be used, or only germanium oxide (GeO$_2$) of the hexagonal crystal may be used. Here, in the case of using a mixed powder of germanium oxide, a germanium oxide powder in which the intensity ratio (the tetragonal crystal/the hexagonal crystal) of the main peak of the hexagonal crystal and the main peak of the tetragonal crystal is adjusted to 0.15 or less is used. Further, indium oxide (In$_2$O$_3$) having a cubic crystal and tin oxide (SnO$_2$)

having a tetragonal crystal are respectively used as an indium oxide powder and a tin oxide powder.

However, as described above, by using a mixed powder in which the component of germanium oxide having a hexagonal crystal is increased as compared with the mixed powder of germanium oxide having a hexagonal crystal and germanium oxide having a tetragonal crystal, a sintered body having a more uniform specific resistance value in the depth direction is obtained. For example, in the case of using a germanium oxide powder of only germanium oxide having a hexagonal crystal, the bulk specific resistance value in the thickness direction falls within the range of 0.97 or more and 1.05 or less with respect to the average value of the bulk specific resistance value.

(Relative Density)

TABLE 1

| Hexagonal GeO$_2$ | | | | | |
| --- | --- | --- | --- | --- | --- |
| Firing temperature (° C.) | 1400 | 1450 | 1500 | 1550 | 1600 |
| Relative density (%) | 85 | 94 | 98 | 99 | 100 |
| Specific resistance (mΩ · cm) | — | 10 | 4 | 2 | 1 |
| Hexagonal GeO$_2$ + Tetragonal GeO$_2$ | | | | | |
| Firing temperature (° C.) | 1400 | 1450 | 1500 | 1550 | 1600 |
| Relative density (%) | 83 | 90 | 96 | 98 | 99 |
| Specific resistance (mΩ · cm) | — | — | 6 | 3 | 2 |

Table 1 is a table showing the relationship between the firing temperature (° C.) and the relative density (%). Further, in Table 1, as a mixed powder of germanium oxide having a hexagonal crystal and germanium oxide having a tetragonal crystal, the intensity ratio (the tetragonal crystal/the hexagonal crystal) of the main peak of the hexagonal crystal and the main peak of the tetragonal crystal is larger than 0.15 is used.

It can be seen that by using, as a germanium oxide powder of the raw material powders, only germanium oxide having a hexagonal crystal (upper part in Table 1) rather than the mixed powder of germanium oxide having a hexagonal crystal and germanium oxide having a tetragonal crystal (lower part in Table 1), the relative density of a sintered body is improved. Further, by setting the firing temperature to 1500° C. or more, a sintered body having the relative density of 97% or more can be obtained. By setting the firing temperature to 1500° C. or more, a sintered body has the specific resistance of 10 mΩ·cm or less.

(Crystalline Structure)

Figure 11:
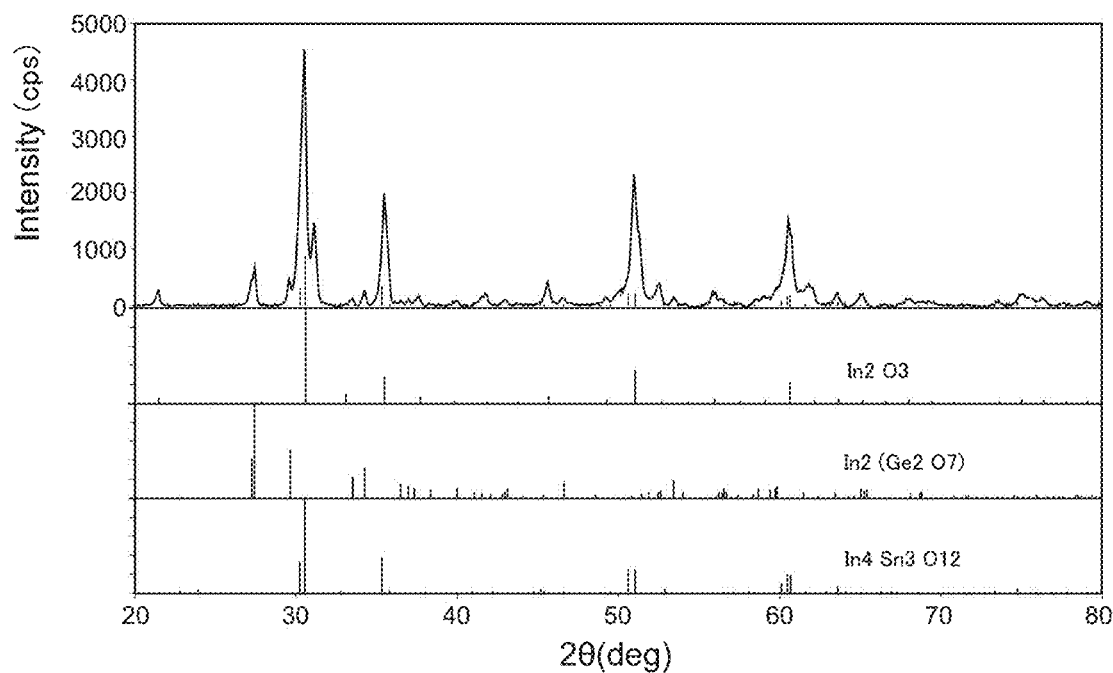
FIG. 11 shows XRD measurement results of a sintered body.

FIG. 11 shows XRD measurement results of a sintered body.

FIG. 11 shows the XRD pattern of an oxide sintered body at the top, and the peak position (2θ) of each solid phase derived from the In$_2$O$_3$ phase, the In$_2$(Ge$_2$O$_7$) phase, and In$_4$Sn$_3$O$_{12}$ in order downward from the XRD pattern are shown.

From the XRD results of the sintered body shown in FIG. 11, it can be seen that the sputtering target has at least one compound phase of the In—O phase, the In—Sn—O phase, and the In—Ge—O phase.

Figure 12:
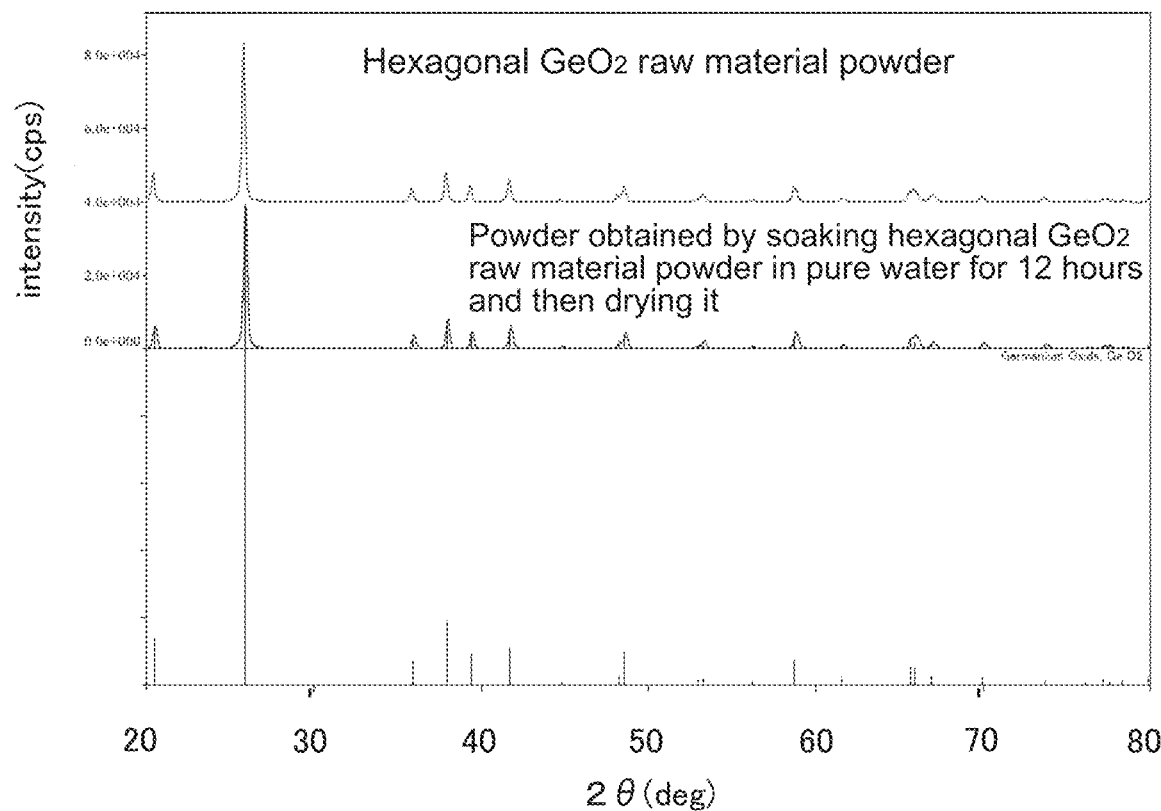
FIG. 12 shows XRD measurement results of a GeO$_2$ raw material powder.

FIG. 12 shows the XRD measurement results of a GeO$_2$ raw material powder.

FIG. 12 shows the XRD pattern of a GeO$_2$ raw material powder having a hexagonal crystal at the top, the XRD pattern of a GeO$_2$ raw material powder having a hexagonal crystal obtained by soaking a GeO$_2$ raw material powder having a hexagonal crystal in pure water and then drying it is shown therebelow, and the peak position (2θ) derived from the GeO$_2$ phase of the hexagonal crystal is shown therebelow.

The results in FIG. 12 show that there is no change in the XRD pattern between the GeO$_2$ raw material powder having a hexagonal crystal before soaking and the GeO$_2$ raw material powder having a hexagonal crystal after soaking and then drying. That is, it means that using slurry containing a GeO$_2$ raw material powder having a hexagonal crystal for the production method according to this embodiment is effective.

Figure 13:
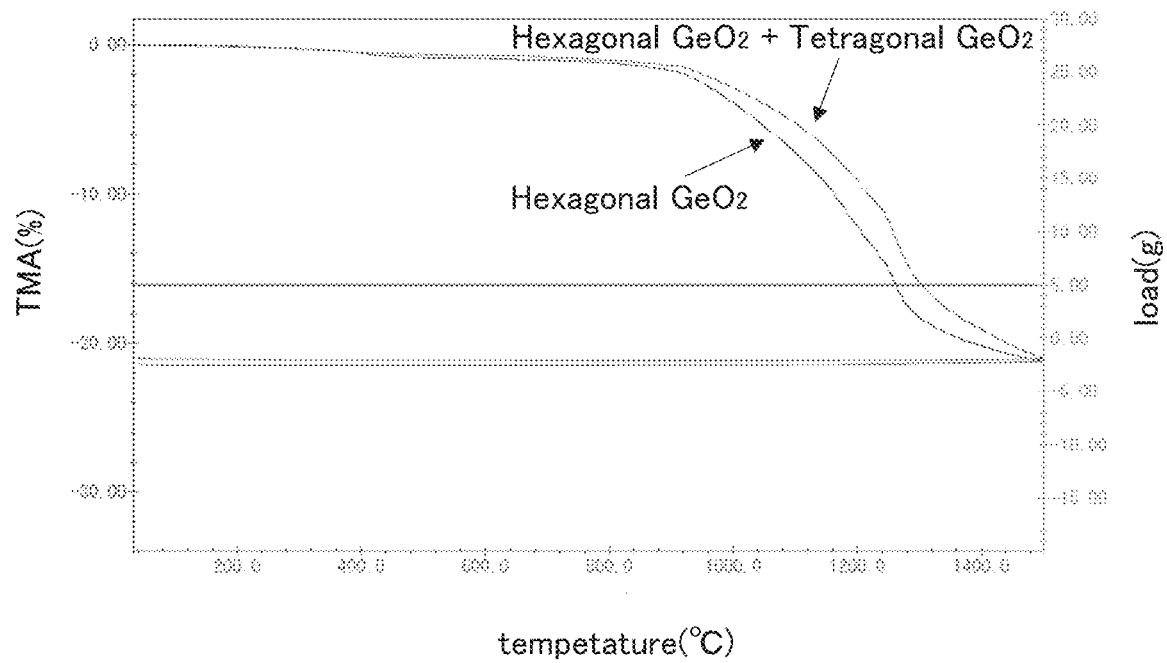
FIG. 13 is a graph diagram showing a relationship between a heating temperature of a granulated powder and a shrinkage rate of a sintered body.

FIG. 13 is a graph diagram showing a relationship between a heating temperature of a granulated powder and a shrinkage rate of a sintered body.

From the TMA results (shrinkage rate) when a granulated powder was heated, it was found that a difference was caused by the type of crystal of a GeO$_2$ raw material powder of the raw material powders. For example, the shrinkage rate increases when only germanium oxide having a hexagonal crystal is used as the raw material powder of germanium oxide as compared with the case of using a mixed powder of germanium oxide having a hexagonal crystal and germanium oxide having a tetragonal crystal. Here, as a mixed powder of germanium oxide having a hexagonal crystal and germanium oxide having a tetragonal crystal, one having the intensity ratio (the tetragonal crystal/the hexagonal crystal) between the main peak of the hexagonal crystal and the main peak of the tetragonal crystal is larger than 0.15 is used (the same applies hereinafter). That is, it was found that the shrinkage rate increased and the sintering property was improved in the case of using only germanium oxide having a hexagonal crystal as the raw material powder of germanium oxide.

Figure 14A:
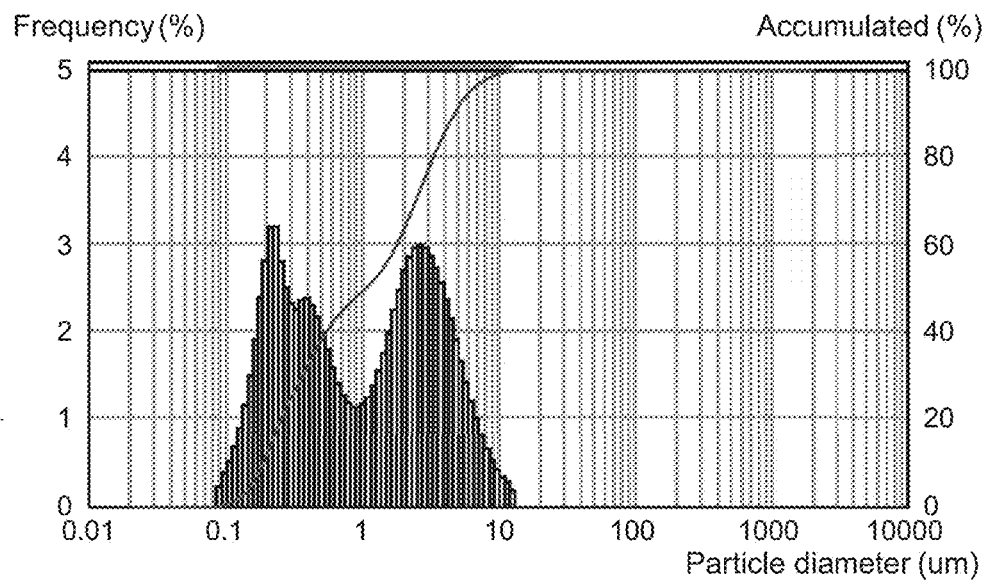
FIGS. 14A and 14B are graph diagrams showing the particle diameter distribution of primary particles after wet grinding.
Figure 14B:
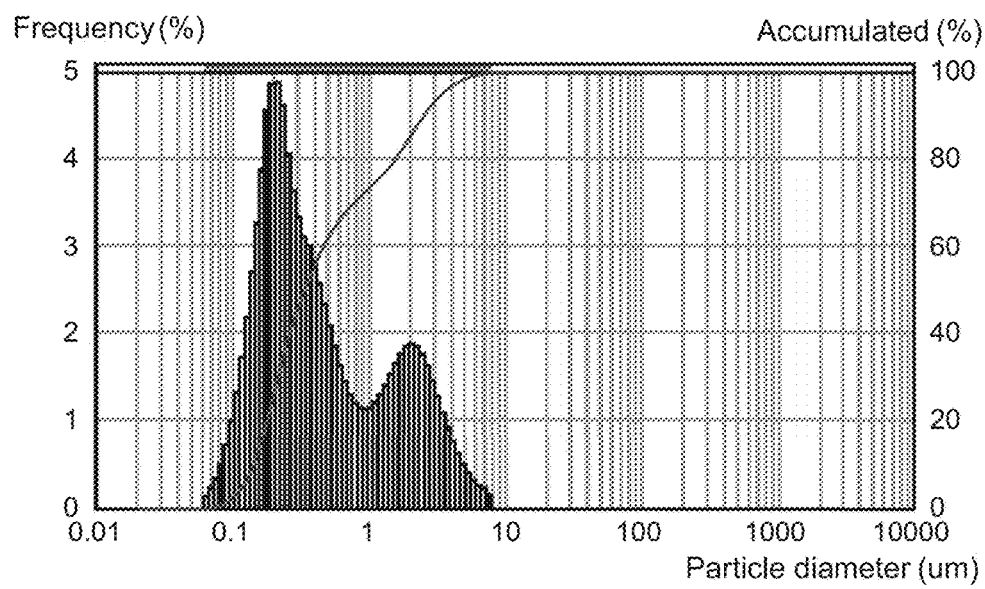

FIGS. 14A and 14B are each a graph diagram showing the particle diameter distribution of primary particles after wet grinding. FIG. 14A shows the results in the case of using a mixed powder of germanium oxide having a hexagonal crystal and germanium oxide having a tetragonal crystal as the raw material powder of germanium oxide of the raw material powders, and FIG. 14B shows the results in the case of using only germanium oxide having a hexagonal crystal as the raw material powder of germanium oxide of the raw material powders.

As shown in FIGS. 14A and 14B, the particle diameter is smaller and the grindability is improved in the case of using only germanium oxide having a hexagonal crystal as the raw material powder of germanium oxide of the raw material powders as compared with the case of using a mixed powder of germanium oxide having a hexagonal crystal and germanium oxide having a tetragonal crystal.

Figure 15A:
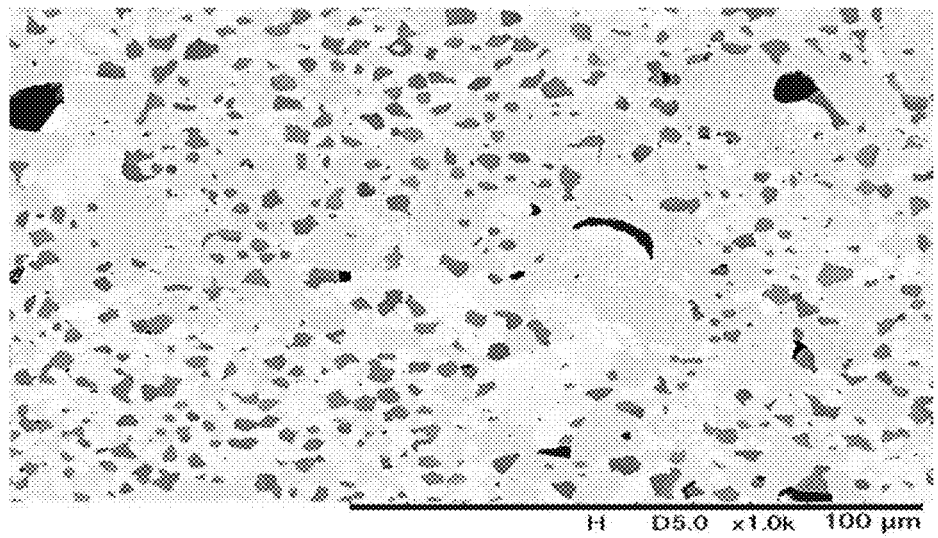
FIGS. 15A and 15B show an electronic microscope image of the polished surface of the sintered body.
Figure 15B:
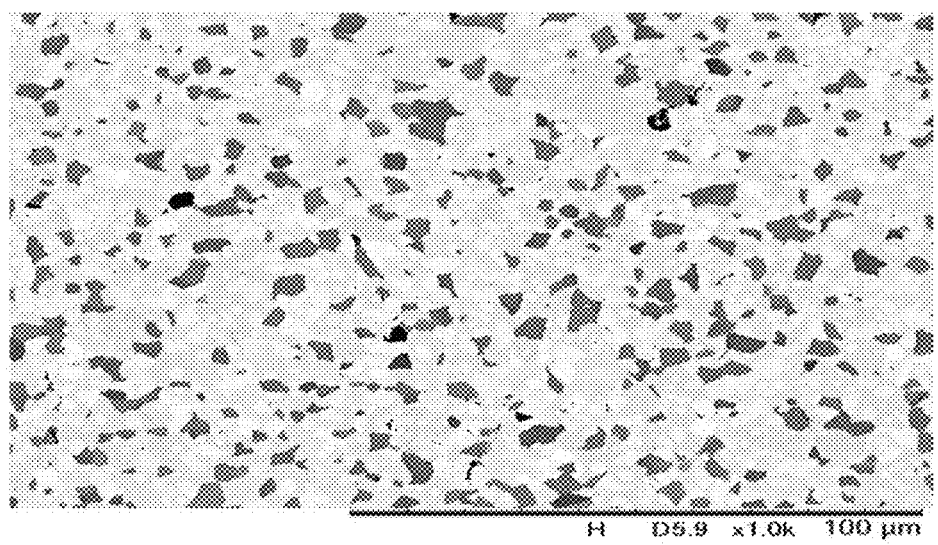

FIGS. 15A and 15B each show an electronic microscope image of the polished surface of the sintered body. FIG. 15A shows the results in the case of using a mixed powder of germanium oxide having a hexagonal crystal and germanium oxide having a tetragonal crystal as the raw material powder of germanium oxide of the raw material powders, and FIG. 15B shows the results in the case of using only germanium oxide having a hexagonal crystal as the raw material powder of germanium oxide of the raw material powders. The firing conditions in FIGS. 15A and 15B are the same.

As shown in FIGS. 15A and 15B, a sintered body having a smaller particle diameter and higher dispersibility of the raw material powder (FIG. 15B) is obtained in the case of using only germanium oxide having a hexagonal crystal as the raw material powder of germanium oxide of the raw material powders as compared with the case of using a mixed powder of germanium oxide having a hexagonal crystal and germanium oxide having a tetragonal crystal (FIG. 15A).

Figure 16:
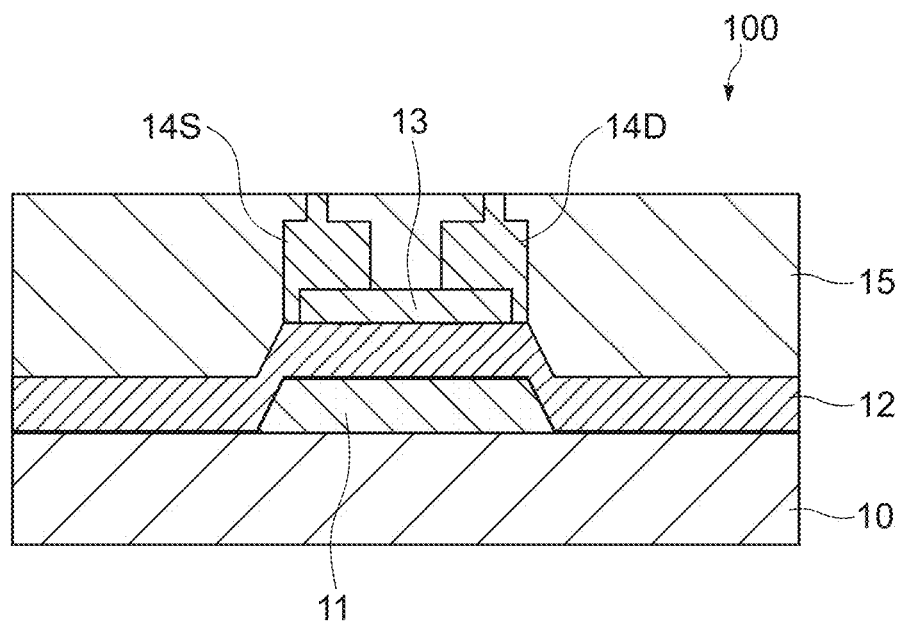
FIG. 16 is a schematic cross-sectional view showing a configuration of a thin film transistor in which a target according to this embodiment is used.

FIG. 16 is a schematic cross-sectional view showing a configuration of a thin film transistor in which a target according to this embodiment is used. In this embodiment, a so-called bottom gate type electric field effect transistor will be described as an example.

Thin Film Transistor

A thin film transistor 100 according to this embodiment includes a gate electrode 11, a gate insulating film 12, an active layer 13, a source electrode 14S, and a drain electrode 14D.

The gate electrode 11 is formed of a conductive film formed on the surface of a base material 10. The base material 10 is typically a transparent glass substrate. The gate electrode 11 typically includes a metal single-layer film or a metal multilayer film of molybdenum (Mo), titanium (Ti), aluminum (Al), copper (Cu), or the like, and is formed by, for example, a sputtering method. In this embodiment, the gate electrode 11 is formed of molybdenum. The thickness of the gate electrode 11 is not particularly limited, and is, for example, 200 nm. The gate electrode 11 is deposited by, for example, a sputtering method, a vacuum vapor deposition method, or the like.

The active layer 13 functions as a channel layer of the thin film transistor 100. The film thickness of the active layer 13 is, for example, 10 nm to 200 nm. The active layer 13 includes an In—Sn—Ge—O oxide semiconductor thin film containing In (indium), Sn (tin), and Ge (germanium). The active layer 13 is deposited by, for example, a sputtering method. The specific composition of the oxide semiconductor thin film described above will be described below.

The gate insulating film 12 is formed between the gate electrode 11 and the active layer 13. The gate insulating film 12 includes, for example, a silicon oxide film (SiOx), a silicon nitride film (SiNx), or a stacked film thereof. The deposition method is not particularly limited, an may be a CVD method, a sputtering method, a vapor deposition method, or the like. The film thickness of the gate insulating film 12 is not particularly limited, and is, for example, 200 nm to 400 nm.

The source electrode 14S and the drain electrode 14D are formed on the active layer 13 to be separated from each other. The source electrode 14S and the drain electrode 14D can include, for example, a metal single-layer film of aluminum, molybdenum, copper, titanium, or the like, or a multilayer film of these metals. As described below, the source electrode 14S and the drain electrode 14D can be simultaneously formed by patterning a metal film. The thickness of the metal film is, for example, 100 nm to 200 nm. The source electrode 14S and the drain electrode 14D are deposited by, for example, a sputtering method, a vacuum vapor deposition method, or the like.

The source electrode 14S and the drain electrode 14D are covered by a protective film 15. The protective film 15 is formed of, for example, an electrically insulating material such as a silicon oxide film, a silicon nitride film, and a stacked film thereof. The protective film 15 is for shielding the device part including the active layer 13 from the outside air. The film thickness of the protective film 15 is not particularly limited, and is, for example, 100 nm to 300 nm. The protective film 15 is deposited by, for example, a CVD method.

After forming the protective film 15, annealing treatment is performed. As a result, the active layer 13 is activated. The annealing condition is not particularly limited. In this embodiment, the annealing is performed in the atmosphere at the temperature of approximately 300° C. for 1 hour.

An interlayer connection hole for connecting the source/drain electrodes 14S and 14D to the wiring layer (not shown) is provided at an appropriate position in the protective film 15. The wiring layer described above is for connecting the thin film transistor 100 to a peripheral circuit (not shown), and includes a transparent conductive film such as ITO.

EXAMPLE

In—Sn—Ge—O oxide thin films were formed by a sputtering method using sputtering targets (φ4 inches×6 mmt), and the basic electrical properties of these films were evaluated using a Hall effect measuring device.

The mobility and the carrier density were measured using a Hall effect measuring device after annealing the oxide semiconductor thin film immediately after deposition at 350° C. for 1 hour in the atmosphere. The crystallinity was evaluated by measuring the X-ray diffraction pattern of a thin film using an X-ray diffraction measuring device and as crystalline when a significant peak was observed and as amorphous when a broad pattern (halo pattern) without a significant peak was observed.

As the deposition conditions, the substrate temperature was set to 100° C., the sputtering gas was a mixed gas of argon and oxygen (oxygen content ratio of 7%), and the film thickness was set to 50 nm.

Experimental Example 1

(Sample No. 2-1)

An In—Sn—O oxide semiconductor thin film in which the atom ratio of each of the elements in the total amount of In and Sn was In: 94.7 at % and Sn: 5.3 at % was prepared on a glass substrate using an In—Sn—O target. The obtained thin film was crystalline. As a result of evaluating the electrical properties of the prepared oxide semiconductor thin film, the mobility was 31.0 cm$^2$/Vs and the carrier density was 6.4E+20 ($6.4\times10^{20}$)/cm$^3$.

(Sample No. 2-2)

An In—Sn—Ge—O oxide semiconductor thin film in which the atom ratio of each of the elements in the total amount of In, Sn, and Ge was In: 90.2 at %, Sn: 4.9 at %, and Ge: 4.9 at % was prepared on a glass substrate using an In—Sn—Ge—O target. The obtained thin film was crystalline. As a result of evaluating the electrical properties of the prepared oxide semiconductor thin film, the mobility was 36.5 cm$^2$/Vs and the carrier density was 1.6E+20 ($1.6\times10^{20}$/cm$^3$.

(Sample No. 2-3)

An In—Sn—Ge—O oxide semiconductor thin film in which the atom ratio of each of the elements in the total amount of In, Sn, and Ge was In: 88.5 at %, Sn: 4.5 at %, and Ge: 7 at % was prepared on a glass substrate using an In—Sn—Ge—O target. The obtained thin film was amorphous. As a result of evaluating the electrical properties of the prepared oxide semiconductor thin film, the mobility was 33.2 cm$^2$/Vs and the carrier density was 9.8E+18 ($9.8\times10^{18}$)/cm$^3$.

(Sample No. 2-4)

An In—Sn—Ge—O oxide semiconductor thin film in which the atom ratio of each of the elements in the total amount of In, Sn, and Ge was In: 83.5 at %, Sn: 4.3 at %, and Ge: 12.2 at % was prepared on a glass substrate using an In—Sn—Ge—O target. The obtained thin film was amorphous. As a result of evaluating the electrical properties of the prepared oxide semiconductor thin film, the mobility was 31.7 cm$^2$/Vs and the carrier density was 7.4E+18 (7.4×10$^{18}$)/cm$^3$.

(Sample No. 2-5)

An In—Sn—Ge—O oxide semiconductor thin film in which the atom ratio of each of the elements in the total amount of In, Sn, and Ge was In: 77.1 at %, Sn: 4.2 at %, and Ge: 18.7 at % was prepared on a glass substrate using an In—Sn—Ge—O target. The obtained thin film was amorphous. As a result of evaluating the electrical properties of the prepared oxide semiconductor thin film, the mobility was 24.5 cm2/Vs and the carrier density was 8.9E+18 (8.9×10$^{18}$)/cm$^3$.

(Sample No. 2-6)

An In—Sn—Ge—O oxide semiconductor thin film in which the atom ratio of each of the elements in the total amount of In, Sn, and Ge was In: 71.9 at %, Sn: 4 at %, and Ge: 24.1 at % was prepared on a glass substrate using an In—Sn—Ge—O target. The obtained thin film was amorphous. As a result of evaluating the electrical properties of the prepared oxide semiconductor thin film, the mobility was 17.1 cm2/Vs and the carrier density was 9.5E+17 (9.5×10$^{17}$)/cm$^3$.

(Sample No. 2-7)

An In—Sn—Ge—O oxide semiconductor thin film in which the atom ratio of each of the elements in the total amount of In, Sn, and Ge was In: 55.5 at %, Sn: 4.5 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 10.2 cm$^2$/Vs and the carrier density was 4.5E+16 (4.5×10$^{16}$)/cm$^3$.

The results of Experimental Example 1 are collectively shown in table 2.

TABLE 2

| No. | Composition at % | | | Carrier density (/cm$^3$) | Mobility (cm$^2$/Vs) | Amorphous |
|---|---|---|---|---|---|---|
| | In | Sn | Ge | | | |
| 2-1 | 94.7 | 5.3 | 0 | 6.4E+20 | 31.0 | x |
| 2-2 | 90.2 | 4.9 | 4.9 | 1.6E+20 | 36.5 | x |
| 2-3 | 88.5 | 4.5 | 7 | 9.8E+18 | 33.2 | o |
| 2-4 | 83.5 | 4.3 | 12.2 | 7.4E+18 | 31.7 | o |
| 2-5 | 77.1 | 4.2 | 18.7 | 8.9E+18 | 24.5 | o |
| 2-6 | 71.9 | 4 | 24.1 | 9.5E+17 | 17.1 | o |
| 2-7 | 55.5 | 4.5 | 40 | 4.5E+16 | 10.2 | o |

Experimental Example 2

(Sample No. 3-1)

An In—Sn—Ge—O oxide semiconductor thin film in which the atom ratio of each of the elements in the total amount of In, Sn, and Ge was In: 88 at %, Sn: 7 at %, and Ge: 5 at % was prepared on a glass substrate using an In—Sn—Ge—O target. The obtained thin film was amorphous.

As a result of evaluating the electrical properties of the prepared oxide semiconductor thin film, the mobility was 31.5 cm$^2$/Vs and the carrier density was 2.9E+20 (2.9×10$^{20}$)/cm$^3$.

(Sample No. 3-2)

An In—Sn—Ge—O oxide semiconductor thin film in which the atom ratio of each of the elements in the total amount of In, Sn, and Ge was In: 86 at %, Sn: 7 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 30.2 cm$^2$/Vs and the carrier density was 1.0E+19 (1.0×10$^{19}$)/cm$^3$.

(Sample No. 3-3)

An In—Sn—Ge—O oxide semiconductor thin film in which the atom ratio of each of the elements in the total amount of In, Sn, and Ge was In: 80 at %, Sn: 7 at %, and Ge: 13 at % was prepared on a glass substrate using an In—Sn—Ge—O target. The obtained thin film was amorphous.

As a result of evaluating the electrical properties of the prepared oxide semiconductor thin film, the mobility was 27.1 cm$^2$/Vs and the carrier density was 7.3E+18 (7.3×10$^{18}$)/cm$^3$.

(Sample No. 3-4)

An In—Sn—Ge—O oxide semiconductor thin film in which the atom ratio of each of the elements in the total amount of In, Sn, and Ge was In: 53 at %, Sn: 7 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 11.0 cm$^2$/Vs and the carrier density was 8.1E+16 (8.1×10$^{16}$)/cm$^3$.

The results of Experimental Example 2 are collectively shown in Table 3.

TABLE 3

| No. | Composition at % | | | Carrier density (/cm$^3$) | Mobility (cm$^2$/Vs) | Amorphous |
|---|---|---|---|---|---|---|
| | In | Sn | Ge | | | |
| 3-1 | 88 | 7 | 5 | 2.9E+20 | 31.5 | o |
| 3-2 | 86 | 7 | 7 | 1.0E+19 | 30.2 | o |
| 3-3 | 80 | 7 | 13 | 7.3E+18 | 27.1 | o |
| 3-4 | 53 | 7 | 40 | 8.1E+16 | 11.0 | o |

Experimental Example 3

(Sample No. 4-1)

An In—Sn—Ge—O oxide semiconductor thin film in which the atom ratio of each of the elements in the total amount of In, Sn, and Ge was In: 77.1 at %, Sn: 18 at %, and Ge: 4.9 at % was prepared on a glass substrate using an In—Sn—Ge—O target. The obtained thin film was amorphous.

As a result of evaluating the electrical properties of the prepared oxide semiconductor thin film, the mobility was 31.5 cm$^2$/Vs and the carrier density was 5.2E+20 (5.2×10$^{20}$)/cm$^3$.

(Sample No. 4-2)

An In—Sn—Ge—O oxide semiconductor thin film in which the atom ratio of each of the elements in the total amount of In, Sn, and Ge was In: 75 at %, Sn: 18 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 32.0 cm$^2$/Vs and the carrier density was 3.1E+19 (3.1×10$^{19}$)/cm$^3$.

(Sample No. 4-3)

An In—Sn—Ge—O oxide semiconductor thin film in which the atom ratio of each of the elements in the total amount of In, Sn, and Ge was In: 71.4 at %, Sn: 18 at %, and Ge: 10.6 at % was prepared on a glass substrate using an In—Sn—Ge—O target. The obtained thin film was amorphous.

As a result of evaluating the electrical properties of the prepared oxide semiconductor thin film, the mobility was 31.6 cm$^2$/Vs and the carrier density was 1.7E+19 (1.7×10$^{19}$)/cm$^3$.

(Sample No. 4-4)

An In—Sn—Ge—O oxide semiconductor thin film in which the atom ratio of each of the elements in the total amount of In, Sn, and Ge was In: 42 at %, Sn: 18 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 10.5 cm$^2$/Vs and the carrier density was 6.6E+11 (6.6×10$^{11}$)/cm$^3$.

The results of Experimental Example 3 are collectively shown in Table 4.

TABLE 4

| No. | Composition at % | | | Carrier density (/cm$^3$) | Mobility (cm$^2$/Vs) | Amorphous |
| --- | --- | --- | --- | --- | --- | --- |
| | In | Sn | Ge | | | |
| 4-1 | 77.1 | 18 | 4.9 | 5.2E+20 | 31.5 | ○ |
| 4-2 | 75 | 18 | 7 | 3.1E+19 | 32.0 | ○ |
| 4-3 | 71.4 | 18 | 10.6 | 1.7E+19 | 31.6 | ○ |
| 4-4 | 42 | 18 | 40 | 6.6E+11 | 10.5 | ○ |

Experimental Example 4

(Sample No. 5-1)

An In—Sn—Ge—O oxide semiconductor thin film in which the atom ratio of each of the elements in the total amount of In, Sn, and Ge was In: 67 at %, Sn: 30 at %, and Ge: 3 at % was prepared on a glass substrate using an In—Sn—Ge—O target. The obtained thin film was amorphous.

As a result of evaluating the electrical properties of the prepared oxide semiconductor thin film, the mobility was 30.2 cm$^2$/Vs and the carrier density was 5.6E+20 (5.6×10$^{20}$)/cm$^3$.

(Sample No. 5-2)

An In—Sn—Ge—O oxide semiconductor thin film in which the atom ratio of each of the elements in the total amount of In, Sn, and Ge was In: 63 at %, Sn: 30 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 32.8 cm$^2$/Vs and the carrier density was 3.3E+19 (3.3×10$^{19}$)/cm$^3$.

(Sample No. 5-3)

An In—Sn—Ge—O oxide semiconductor thin film in which the atom ratio of each of the elements in the total amount of In, Sn, and Ge was In: 60 at %, Sn: 30 at %, and Ge: 10 at % was prepared on a glass substrate using an In—Sn—Ge—O target. The obtained thin film was amorphous.

As a result of evaluating the electrical properties of the prepared oxide semiconductor thin film, the mobility was 30.0 cm$^2$/Vs and the carrier density was 1.5E+19 (1.5×10$^{19}$)/cm$^3$.

(Sample No. 5-4)

An In—Sn—Ge—O oxide semiconductor thin film in which the atom ratio of each of the elements in the total amount of In, Sn, and Ge was In: 30 at %, Sn: 30 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 11.5 cm$^2$/Vs and the carrier density was 7.7E+16 (7.7×10$^{16}$)/cm$^3$.

The results of Experimental Example 4 are collectively shown in Table 5.

TABLE 5

| No. | Composition at % | | | Carrier density (/cm$^3$) | Mobility (cm$^2$/Vs) | Amorphous |
| --- | --- | --- | --- | --- | --- | --- |
| | In | Sn | Ge | | | |
| 5-1 | 67 | 30 | 3 | 5.6E+20 | 30.2 | ○ |
| 5-2 | 63 | 30 | 7 | 3.3E+19 | 32.8 | ○ |
| 5-3 | 60 | 30 | 10 | 1.5E+19 | 30.0 | ○ |
| 5-4 | 30 | 30 | 40 | 7.7E+16 | 11.5 | ○ |

Experimental Example 5

(Sample No. 6-1)

An In—Sn—Ge—O oxide semiconductor thin film in which the atom ratio of each of the elements in the total amount of In, Sn, and Ge was In: 36 at %, Sn: 60 at %, and Ge: 4 at % was prepared on a glass substrate using an In—Sn—Ge—O target. The obtained thin film was amorphous.

As a result of evaluating the electrical properties of the prepared oxide semiconductor thin film, the mobility was 25.2 cm$^2$/Vs and the carrier density was 6.0E+20 (6.0×10$^{20}$)/cm$^3$.

(Sample No. 6-2)

An In—Sn—Ge—O oxide semiconductor thin film in which the atom ratio of each of the elements in the total amount of In, Sn, and Ge was In: 33 at %, Sn: 60 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 18.2 cm$^2$/Vs and the carrier density was 2.2E+19 (2.2×10$^{19}$)/cm$^3$.

(Sample No. 6-3)

An In—Sn—Ge—O oxide semiconductor thin film in which the atom ratio of each of the elements in the total amount of In, Sn, and Ge was In: 31 at %, Sn: 60 at %, and Ge: 9 at % was prepared on a glass substrate using an In—Sn—Ge—O target. The obtained thin film was amorphous.

As a result of evaluating the electrical properties of the prepared oxide semiconductor thin film, the mobility was 11.3 cm$^2$/Vs and the carrier density was 1.6E+19 (1.6×10$^{19}$)/cm$^3$.

(Sample No. 6-4)

An In—Sn—Ge—O oxide semiconductor thin film in which the atom ratio of each of the elements in the total amount of In, Sn, and Ge was In: 2 at %, Sn: 58 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 3.5 cm$^2$/Vs and the carrier density was 7.3E+16 (7.3×10$^{16}$)/cm$^3$.

The results of Experimental Example 5 are collectively shown in Table 6.

TABLE 6

| No. | Composition at % | | | Carrier density (/cm$^3$) | Mobility (cm$^2$/Vs) | Amorphous |
|---|---|---|---|---|---|---|
| | In | Sn | Ge | | | |
| 6-1 | 36 | 60 | 4 | 6.0E+20 | 25.2 | ○ |
| 6-2 | 33 | 60 | 7 | 2.2E+19 | 18.2 | ○ |
| 6-3 | 31 | 60 | 9 | 1.6E+19 | 11.3 | ○ |
| 6-4 | 2 | 58 | 40 | 7.3E+16 | 3.5 | ○ |

Experimental Example 6

(Sample No. 7-1)

An In—Sn—Ge—O oxide semiconductor thin film in which the atom ratio of each of the elements in the total amount of In, Sn, and Ge was In: 91 at %, Sn: 2 at %, and Ge: 7 at % was prepared on a glass substrate using an In—Sn—Ge—O target. The obtained thin film was crystalline.

As a result of evaluating the electrical properties of the prepared oxide semiconductor thin film, the mobility was 35.2 cm$^2$/Vs and the carrier density was 8.9E+19 (8.9×10$^{19}$)/cm$^3$.

(Sample No. 7-2)

An In—Sn—Ge—O oxide semiconductor thin film in which the atom ratio of each of the elements in the total amount of In, Sn, and Ge was In: 89 at %, Sn: 4 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 33.2 cm$^2$/Vs and the carrier density was 9.8E+18 (9.8×10$^{18}$)/cm$^3$.

(Sample No. 7-3)

An In—Sn—Ge—O oxide semiconductor thin film in which the atom ratio of each of the elements in the total amount of In, Sn, and Ge was In: 86 at %, Sn: 7 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 30.2 cm$^2$/Vs and the carrier density was 1.0E+19 (1.0×10$^{19}$)/cm$^3$.

(Sample No. 7-4)

An In—Sn—Ge—O oxide semiconductor thin film in which the atom ratio of each of the elements in the total amount of In, Sn, and Ge was In: 73 at %, Sn: 20 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 32.0 cm$^2$/Vs and the carrier density was 3.1E+19 (3.1×10$^{19}$)/cm$^3$.

(Sample No. 7-5)

An In—Sn—Ge—O oxide semiconductor thin film in which the atom ratio of each of the elements in the total amount of In, Sn, and Ge was In: 63 at %, Sn: 30 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 30.8 cm$^2$/Vs and the carrier density was 3.3E+19 (3.3×10$^{19}$)/cm$^3$.

(Sample No. 7-6)

An In—Sn—Ge—O oxide semiconductor thin film in which the atom ratio of each of the elements in the total amount of In, Sn, and Ge was In: 33 at %, Sn: 60 at %, and Ge: 7 at % was prepared on a glass substrate using an In—Sn—Ge—O target. The obtained thin film was amorphous.

As a result of evaluating the electrical properties of the prepared oxide semiconductor thin film, the mobility was 18.2 cm$^2$/Vs and the carrier density was 2.2E+19 (2.2×10$^{19}$)/cm$^3$.

The results of Experimental Example 6 are collectively shown in Table 7.

TABLE 7

| No. | Composition at % | | | Carrier density (/cm$^3$) | Mobility (cm$^2$/Vs) | Amorphous |
|---|---|---|---|---|---|---|
| | In | Sn | Ge | | | |
| 7-1 | 91 | 2 | 7 | 8.9E+19 | 35.2 | x |
| 7-2 | 89 | 4 | 7 | 9.8E+18 | 33.2 | ○ |
| 7-3 | 86 | 7 | 7 | 1.0E+19 | 30.2 | ○ |
| 7-4 | 73 | 20 | 7 | 3.1E+19 | 32.0 | ○ |
| 7-5 | 63 | 30 | 7 | 3.3E+19 | 30.8 | ○ |
| 7-6 | 33 | 60 | 7 | 2.2E+19 | 18.2 | ○ |

Experimental Example 7

(Sample No. 8-1)

An In—Sn—Ge—O oxide semiconductor thin film in which the atom ratio of each of the elements in the total amount of In, Sn, and Ge was In: 58 at %, Sn: 2 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 8.2 cm$^2$/Vs and the carrier density was 3.8E+16 (3.8×10$^{16}$)/cm$^3$.

(Sample No. 8-2)

An In—Sn—Ge—O oxide semiconductor thin film in which the atom ratio of each of the elements in the total amount of In, Sn, and Ge was In: 56 at %, Sn: 4 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 10.2 cm$^2$/Vs and the carrier density was 4.5E+16 (4.5×10$^{16}$)/cm$^3$.

(Sample No. 8-3)

An In—Sn—Ge—O oxide semiconductor thin film in which the atom ratio of each of the elements in the total amount of In, Sn, and Ge was In: 53 at %, Sn: 7 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 11.0 cm$^2$/Vs and the carrier density was 8.1E+16 (8.1×10$^{16}$)/cm$^3$.

(Sample No. 8-4)

An In—Sn—Ge—O oxide semiconductor thin film in which the atom ratio of each of the elements in the total amount of In, Sn, and Ge was In: 40 at %, Sn: 20 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 10.5 cm$^2$/Vs and the carrier density was 6.6E+16 (6.6×10$^{16}$)/cm$^3$.

(Sample No. 8-5)

An In—Sn—Ge—O oxide semiconductor thin film in which the atom ratio of each of the elements in the total amount of In, Sn, and Ge was In: 30 at %, Sn: 30 at %, and Ge: 40 at % was prepared on a glass substrate using an In—Sn—Ge—O target. The obtained thin film was amorphous.

As a result of evaluating the electrical properties of the prepared oxide semiconductor thin film, the mobility was 11.5 cm$^2$/Vs and the carrier density was 7.7E+16 (7.7×10$^{16}$)/cm$^3$.

(Sample No. 8-6)

An Sn—Ge—O oxide semiconductor thin film in which the atom ratio of each of the elements in the total amount of Sn and Ge was Sn: 60 at % and Ge: 40 at % was prepared on a glass substrate using an Sn—Ge—O target. The obtained thin film was amorphous.

As a result of evaluating the electrical properties of the prepared oxide semiconductor thin film, the mobility was 3.5 cm$^2$/Vs and the carrier density was 7.3E+16 (7.3×10$^{16}$)/cm$^3$.

The results of Experimental Example 7 are collectively shown in Table 8

TABLE 8

| No. | Composition at % | | | Carrier density (/cm$^3$) | Mobility (cm$^2$/Vs) | Amorphous |
|---|---|---|---|---|---|---|
| | In | Sn | Ge | | | |
| 8-1 | 58 | 2 | 40 | 3.8E+16 | 8.2 | ○ |
| 8-2 | 56 | 4 | 40 | 4.5E+16 | 10.2 | ○ |
| 8-3 | 53 | 7 | 40 | 8.1E+16 | 11.0 | ○ |
| 8-4 | 40 | 20 | 40 | 6.6E+16 | 10.5 | ○ |
| 8-5 | 30 | 30 | 40 | 7.7E+16 | 11.5 | ○ |
| 8-6 | 0 | 60 | 40 | 7.3E+16 | 3.5 | ○ |

Experimental Example 8

(Sample No. 9-1)

An In—Sn—Ge—Ti—O oxide semiconductor thin film in which the atom ratio of each of the elements in the total amount of In, Sn, Ge, and Ti was In: 80 at %, Sn: 7 at %, Ge: 10 at %, and Ti: 3 at % was prepared on a glass substrate using a target obtained by adding Ti as the first element (α) to an In—Sn—Ge—O material. The obtained thin film was amorphous.

As a result of evaluating the electrical properties of the prepared oxide semiconductor thin film, the mobility was 21.8 cm$^2$/Vs and the carrier density was 2.3E+18 (2.3×10$^{18}$)/cm$^3$.

(Sample No. 9-2)

An In—Sn—Ge—Ti—O oxide semiconductor thin film in which the atom ratio of each of the elements in the total amount of In, Sn, Ge, and Ti was In: 79 at %, Sn: 7 at %, Ge: 10 at %, and Ti: 4 at % was prepared on a glass substrate using a target obtained by adding Ti as the first element (α) to an In—Sn—Ge—O material. The obtained thin film was amorphous.

As a result of evaluating the electrical properties of the prepared oxide semiconductor thin film, the mobility was 18.8 cm$^2$/Vs and the carrier density was 1.9E+18 (1.9×10$^{18}$)/cm$^3$.

(Sample No. 9-3)

An In—Sn—Ge—Ti—O oxide semiconductor thin film in which the atom ratio of each of the elements in the total amount of In, Sn, Ge, and Ti was In: 76 at %, Sn: 7 at %, Ge: 10 at %, and Ti: 7 at % was prepared on a glass substrate using a target obtained by adding Ti as the first element (α) to an In—Sn—Ge—O material. The obtained thin film was amorphous.

As a result of evaluating the electrical properties of the prepared oxide semiconductor thin film, the mobility was 15.0 cm$^2$/Vs and the carrier density was 7.9E+17 (7.9×10$^{17}$)/cm$^3$.

(Sample No. 9-4)

An In—Sn—Ge—Ti—O oxide semiconductor thin film in which the atom ratio of each of the elements in the total amount of In, Sn, Ge, and Ti was In: 71 at %, Sn: 7 at %, Ge: 10 at %, and Ti: 12 at % was prepared on a glass substrate using a target obtained by adding Ti as the first element (α) to an In—Sn—Ge—O material. The obtained thin film was amorphous.

As a result of evaluating the electrical properties of the prepared oxide semiconductor thin film, the mobility was 6.5 cm$^2$/Vs and the carrier density was 1.2E+17 (1.2×10$^{17}$)/cm$^3$.

(Sample No. 9-5)

An In—Sn—Ge—Ca—O oxide semiconductor thin film in which the atom ratio of each of the elements in the total amount of In, Sn, Ge, and Ca was In: 82 at %, Sn: 7 at %, Ge: 10 at %, and Ca: 1 at % was prepared on a glass substrate using a target obtained by adding Ca as the first element (α) to an In—Sn—Ge—O material. The obtained thin film was amorphous.

As a result of evaluating the electrical properties of the prepared oxide semiconductor thin film, the mobility was 25.9 cm$^2$Vs and the carrier density was 9.0E+18 (9.0×10$^{18}$)/cm$^3$.

(Sample No. 9-6)

An In—Sn—Ge—Ca—O oxide semiconductor thin film in which the atom ratio of each of the elements in the total amount of In, Sn, Ge, and Ca was In: 80 at %, Sn: 7 at %, Ge: 10 at %, and Ca: 3 at % was prepared on a glass substrate using a target obtained by adding Ca as the first element (α) to an In—Sn—Ge—O material. The obtained thin film was amorphous.

As a result of evaluating the electrical properties of the prepared oxide semiconductor thin film, the mobility was 20.5 cm$^2$/Vs and the carrier density was 3.4E+18 (3.4×10$^{18}$)/cm$^3$.

(Sample No. 9-7)

An In—Sn—Ge—Ca—O oxide semiconductor thin film in which the atom ratio of each of the elements in the total amount of In, Sn, Ge, and Ca was In: 78 at %, Sn: 7 at %, Ge: 10 at %, and Ca: 5 at % was prepared on a glass substrate using a target obtained by adding Ca as the first element (α) to an In—Sn—Ge—O material. The obtained thin film was amorphous.

As a result of evaluating the electrical properties of the prepared oxide semiconductor thin film, the mobility was 18.9 cm$^2$/Vs and the carrier density was 1.9E+18 (1.9×10$^{18}$)/cm$^3$.

(Sample No. 9-8)

An In—Sn—Ge—Ca—O oxide semiconductor thin film in which the atom ratio of each of the elements in the total amount of In, Sn, Ge, and Ca was In: 71 at %, Sn: 7 at %, Ge: 10 at %, and Ca: 12 at % was prepared on a glass substrate using a target obtained by adding Ca as the first element (α) to an In—Sn—Ge—O material. The obtained thin film was amorphous.

As a result of evaluating the electrical properties of the prepared oxide semiconductor thin film, the mobility was 8.9 cm$^2$/Vs and the carrier density was 6.1E+17 (6.1×10$^{17}$)/cm$^3$.

(Sample No. 9-9)

An In—Sn—Ge—Ga—O oxide semiconductor thin film in which the atom ratio of each of the elements in the total amount of In, Sn, Ge, and Ga was In: 79.5 at %, Sn: 7 at %, Ge: 10 at %, and Ga: 3.5 at % was prepared on a glass substrate using a target obtained by adding Ga as the second element (β) to an In—Sn—Ge—O material. The obtained thin film was amorphous.

As a result of evaluating the electrical properties of the prepared oxide semiconductor thin film, the mobility was 26.6 cm$^2$/Vs and the carrier density was 7.2E+18 (7.2×10$^{18}$)/cm$^3$.

(Sample No. 9-10)

An In—Sn—Ge—Ga—O oxide semiconductor thin film in which the atom ratio of each of the elements in the total amount of In, Sn, Ge, and Ga was In: 75.6 at %, Sn: 7 at %, Ge: 10 at %, and Ga: 7.4 at % was prepared on a glass substrate using a target obtained by adding Ga as the second element (β) to an In—Sn—Ge—O material. The obtained thin film was amorphous.

As a result of evaluating the electrical properties of the prepared oxide semiconductor thin film, the mobility was 22.4 cm$^2$/Vs and the carrier density was 3.6E+18 (3.6×10$^{18}$)/cm$^3$.

(Sample No. 9-11)

An In—Sn—Ge—Ga—O oxide semiconductor thin film in which the atom ratio of each of the elements in the total amount of In, Sn, Ge, and Ga was In: 69.7 at %, Sn: 7 at %, Ge: 10 at %, and Ga: 13.3 at % was prepared on a glass substrate using a target obtained by adding Ga as the second element (β) to an In—Sn—Ge—O material. The obtained thin film was amorphous.

As a result of evaluating the electrical properties of the prepared oxide semiconductor thin film, the mobility was 17.6 cm$^2$/Vs and the carrier density was 2.4E+18 (2.4×10$^{18}$)/cm$^3$.

(Sample No. 9-12)

An In—Sn—Ge—Ga—O oxide semiconductor thin film in which the atom ratio of each of the elements in the total amount of In, Sn, Ge, and Ga was In: 59 at %, Sn: 7 at %, Ge: 10 at %, and Ga: 24 at % was prepared on a glass substrate using a target obtained by adding Ga as the second element (β) to an In—Sn—Ge—O material. The obtained thin film was amorphous.

As a result of evaluating the electrical properties of the prepared oxide semiconductor thin film, the mobility was 10.2 cm$^2$/Vs and the carrier density was 1.0E+18 (1.0×10$^{18}$)/cm$^3$.

The results of Experimental Example 8 are collectively shown in Table 9.

TABLE 9

| No. | Composition at % | | | | Carrier density (/cm$^3$) | Mobility (cm$^2$/Vs) |
| --- | --- | --- | --- | --- | --- | --- |
| | In | Sn | Ge | α/β | | |
| 9-1 | 80 | 7 | 10 | Ti 3 | 2.3E+18 | 21.8 |
| 9-2 | 79 | 7 | 10 | Ti 4 | 1.9E+18 | 18.8 |
| 9-3 | 76 | 7 | 10 | Ti 7 | 7.9E+17 | 15.0 |
| 9-4 | 71 | 7 | 10 | Ti 12 | 1.2E+17 | 6.5 |
| 9-5 | 82 | 7 | 10 | Ca 1 | 9.0E+18 | 25.9 |
| 9-6 | 80 | 7 | 10 | Ca 3 | 3.4E+18 | 20.5 |
| 9-7 | 78 | 7 | 10 | Ca 5 | 1.9E+18 | 18.9 |
| 9-8 | 71 | 7 | 10 | Ca 12 | 6.1E+17 | 8.9 |
| 9-9 | 79.5 | 7 | 10 | Ga 3.5 | 7.2E+18 | 26.6 |
| 9-10 | 75.6 | 7 | 10 | Ga 7.4 | 3.6E+18 | 22.4 |
| 9-11 | 69.7 | 7 | 10 | Ga 13.3 | 2.4E+18 | 17.6 |
| 9-12 | 59 | 7 | 10 | Ga 24 | 1.0E+18 | 10.2 |

From the results of Experimental Examples 1 to 8, the larger the content of In, the higher the mobility, and the larger the content of Ge, the lower the carrier density. In particular, by setting the content of Ge to 7 at % or more, the carrier density in the film can be suppressed to the order of 10$^{19}$/cm$^3$ or less. Further, by setting the content of Ge to 40 at % or less, it is possible to achieve high mobility of approximately 20 to 35 cm$^2$/Vs. Further, by setting the content of Ge to 40 at % or less, the mobility of 10 cm$^2$/Vs or more is easily achieved.

Meanwhile, the larger the content of Sn, the more easily an amorphous thin film can be obtained. For example, by setting the content of Sn to 4 at % or more, it is possible to obtain an amorphous thin film even in a sample having the content of Ge of 7 at % (see Sample 2-3). Further, the higher the content of Sn, it is possible to suppress the decrease in mobility with the increase in the content of Ge. It is suitable to optimize the content of Sn I accordance with the content of Ge, and the content of Sn is favorably 60 at % or less in order to ensure the mobility of 10 cm$^2$/Vs or more.

Further, from the results of Experimental Example 8, it was confirmed that the higher the content of the first element (α) or the second element (β), the lower the carrier density, so that it functioned as a carrier killer even in an In—Sn—Ge oxide semiconductor. Note that since the mobility is also reduced by the addition of the first element (α) or the second element (β), the content of the first element (α) is favorably 10 at % or less and the content of the second element (β) is favorably 25 at % or less in order to ensure the mobility of 10 cm²/Vs or more. Note that the minimum content of the first element (α) or the second element (β) is not particularly limited as long as the effect as a carrier killer can be observed, and may be 1 at % or less.

Experimental Example 9

(Sample No. 10-1)
An In—Sn—Ge—O oxide semiconductor thin film in which the atom ratio of each of the elements in the total amount of In, Sn, and Ge was In: 83 at %, Sn: 10 at %, and Ge: 7 at % was prepared by a sputtering method on a glass substrate using an In—Sn—Ge—O target. A thin film transistor having the structure shown in FIG. 16 was prepared using the prepared oxide semiconductor thin film as an active layer, and the respective transistor characteristics (the mobility, the threshold value voltage (Vth), PBTS (ΔVth), and NBTS (ΔVth)) were evaluated.

The PBTS (ΔVth) was a change amount of the threshold value voltage after applying a gate voltage of +30 V at the temperature of 60° C. for 60 minutes.

The NBTS (ΔVth) was a change amount of the threshold value voltage after applying a gate voltage of −30 V at the temperature of 60° C. for 60 minutes.

As the deposition conditions, the substrate temperature was set to 100° C., the sputtering gas was a mixed gas of argon and oxygen (oxygen content ratio of 7%), and the film thickness was set to 50 nm.

As a result of the evaluation, the mobility was 44.3 cm²/Vs, the threshold value voltage (Vth) was 3.6 V, the PBTS (Vth) was +0.6 V, and the NBTS (Vth) was −1.0 V.
(Sample No. 10-2)
An In—Sn—Ge—O oxide semiconductor thin film in which the atom ratio of each of the elements in the total amount of In, Sn, and Ge was In: 73 at %, Sn: 20 at %, and Ge: 7 at % was prepared by a sputtering method on a glass substrate using an In—Sn—Ge—O target. A thin film transistor having the structure shown in FIG. 16 was prepared using the prepared oxide semiconductor thin film as an active layer, and the respective transistor characteristics (the mobility, the threshold value voltage (Vth), PBTS (ΔVth), and NBTS (ΔVth)) were evaluated.

As a result of the evaluation, the mobility was 40.2 cm²/Vs, the threshold value voltage (Vth) was 3.5 V, the PBTS (Vth) was +0.6 V, and the NBTS (Vth) was −1.4 V.
(Sample No. 10-3)
An In—Sn—Ge—O oxide semiconductor thin film in which the atom ratio of each of the elements in the total amount of In, Sn, and Ge was In: 75 at %, Sn: 10 at %, and Ge: 15 at % was prepared by a sputtering method on a glass substrate using an In—Sn—Ge—O target. A thin film transistor having the structure shown in FIG. 16 was prepared using the prepared oxide semiconductor thin film as an active layer, and the respective transistor characteristics (the mobility, the threshold value voltage (Vth), PBTS (ΔVth), and NBTS (ΔVth)) were evaluated.

As a result of the evaluation, the mobility was 37.2 cm²/Vs, the threshold value voltage (Vth) was 3.8 V, and the PBTS (Vth) was +0.7 V, and the NBTS (Vth) was −0.9 V.

(Sample No. 10-4)
An In—Sn—Ge—O oxide semiconductor thin film in which the atom ratio of each of the elements in the total amount of In, Sn, and Ge was In: 65 at %, Sn: 20 at %, and Ge: 15 at % was prepared by a sputtering method on a glass substrate using an In—Sn—Ge—O target. A thin film transistor having the structure shown in FIG. 16 was prepared using the prepared oxide semiconductor thin film as an active layer, and the respective transistor characteristics (the mobility, the threshold value voltage (Vth), PBTS (ΔVth), and NBTS (ΔVth)) were evaluated.

As a result of the evaluation, the mobility was 31.2 cm²/Vs, the threshold value voltage (Vth) was 4.0 V, the PBTS (Vth) was +0.6 V, and the NBTS (Vth) was −1.0 V.
(Sample No. 10-5)
An In—Sn—Ge—O oxide semiconductor thin film in which the atom ratio of each of the elements in the total amount of In, Sn, and Ge was In: 70 at %, Sn: 10 at %, and Ge: 20 at % was prepared by a sputtering method on a glass substrate using an In—Sn—Ge—O target. A thin film transistor having the structure shown in FIG. 16 was prepared using the prepared oxide semiconductor thin film as an active layer, and the respective transistor characteristics (the mobility, the threshold value voltage (Vth), PBTS (ΔVth), and NBTS (ΔVth)) were evaluated.

As a result of the evaluation, the mobility was 20.1 cm²/Vs, the threshold value voltage (Vth) was 4.1 V, the PBTS (Vth) was +1.0 V, and the NBTS (Vth) was −0.7 V.
(Sample No. 10-6)
An In—Sn—Ge—O oxide semiconductor thin film in which the atom ratio of each of the elements in the total amount of In, Sn, and Ge was In: 60 at %, Sn: 20 at %, and Ge: 20 at % was prepared by a sputtering method on a glass substrate using an In—Sn—Ge—O target. A thin film transistor having the structure shown in FIG. 16 was prepared using the prepared oxide semiconductor thin film as an active layer, and the respective transistor characteristics (the mobility, the threshold value voltage (Vth), PBTS (ΔVth), and NBTS (ΔVth)) were evaluated.

As a result of the evaluation, the mobility was 19.8 cm²/Vs, the threshold value voltage (Vth) was 4.2 V, the PBTS (Vth) was +0.9 V, and the NBTS (Vth) was −0.6 V.

The results of Experimental Example 9 are collectively shown in Table 10.

TABLE 10

| No. | Composition at % | | | Mobility (cm²/Vs) | Vth (V) | PBTS (ΔVth) | NBTS (ΔVth) |
| --- | --- | --- | --- | --- | --- | --- | --- |
| | In | Sn | Ge | | | | |
| 10-1 | 83 | 10 | 7 | 44.3 | 3.6 | 0.6 | −1.0 |
| 10-2 | 73 | 20 | 7 | 40.2 | 3.5 | 0.6 | −1.4 |
| 10-3 | 75 | 10 | 15 | 37.2 | 3.8 | 0.7 | −0.9 |
| 10-4 | 65 | 20 | 15 | 31.2 | 4.0 | 0.6 | −1.0 |
| 10-5 | 70 | 10 | 20 | 20.1 | 4.1 | 1.0 | −0.7 |
| 10-6 | 60 | 20 | 20 | 19.8 | 4.2 | 0.9 | −0.6 |

From the results of Experimental Example 9, in a thin film transistor using, as an active layer, an In—Sn—Ge oxide semiconductor thin film having the content of Ge of 7 at % or more, it was confirmed that high mobility of approximately 20 cm²/Vs or more could be achieved. Further, it was confirmed that both the PBTS property and the NBTS property, which are indices of the reliability of a switching operation, were favorable values.

Although an embodiment of the present invention has been described, it goes without saying that the present invention is not limited to the above-mentioned embodiment and various modifications may be made.

For example, although a so-called bottom gate type (inverted staggered type) transistor has been described as an example in the embodiment described above, the present invention is applicable also to a top gate type (staggered type) thin film transistor.

Further, the above-mentioned thin film transistor can be used as a TFT for an active matrix display panel such as a liquid crystal display and an organic EL display. In addition, the transistor described above can be used as a transistor element of various semiconductor apparatuses or electronic apparatuses.

Although an embodiment of the present invention has been described, the present invention is not limited to the above-mentioned embodiment and various modifications can be made. The respective embodiments are not limited to an independent form and can be combined as much as technologically possible.

REFERENCE SIGNS LIST 10 base material
11 gate electrode
12 gate insulating film
13 active layer
14S source electrode
14D drain electrode
15 protective film
100 thin film transistor

The invention claimed is:

1. A sputtering target, comprising:
an oxide sintered body including indium, tin, and germanium,
wherein an atom ratio of indium with respect to the total of indium, tin, and germanium is 0.3 or more,
wherein an atom ratio of germanium with respect to a total of indium, tin, and germanium is 0.07 or more and 0.40 or less,
wherein an atom ratio of tin with respect to the total of indium, tin, and germanium is 0.04 or more and 0.60 or less,
wherein a specific resistance value in a thickness direction of the oxide sintered body falls within a range of 0.8 or more and 1.2 or less with respect to an average value of a bulk specific resistance value, and
wherein raw material powder used for the oxide sintered body comprises an indium oxide powder, a tin oxide powder, and a germanium oxide powder in which an intensity ratio between a main peak of a hexagonal crystal and a main peak of a tetragonal crystal is 0.15 or less.

2. The sputtering target according to claim 1, wherein an atom ratio of germanium with respect to the total of indium, tin, and germanium is 0.10 or more and 0.25 or less.

3. The sputtering target according to claim 1, wherein the oxide sintered body further includes a first element that is at least one element selected from the group consisting of Si, Ti, Mg, Ca, Ba, Zr, Al, W, Ta, Hf, and B.

4. The sputtering target according to claim 3, wherein an atom ratio of the first element with respect to a total of indium, tin, germanium, and the first element is 0.10 or less.

5. The sputtering target according to claim 1, wherein the oxide sintered body further includes a second element that is at least one element selected from the group consisting of Sr, Ga, and Zn.

6. The sputtering target according to claim 5, wherein an atom ratio of the second element with respect to a total of indium, tin, germanium, and the second element is 0.25 or less.

7. The sputtering target according to claim 1, wherein a relative density is 97% or more.

8. The sputtering target according to claim 1, wherein a specific resistance value is 0.1 mΩ·cm or more and 10 mΩ·cm or less.

9. The sputtering target according to claim 1, wherein the oxide sintered body has at least one compound phase of an In—O phase, an In—Sn—O phase, and an In—Ge—O phase.

10. A method of producing the sputtering target according to claim 1, the method comprising:
forming a molded body by mixing an indium oxide powder, a tin oxide powder, and a germanium oxide powder in which an intensity ratio between a main peak of a hexagonal crystal and a main peak of a tetragonal crystal is adjusted to 0.15 or less; and
producing a sputtering target including an oxide sintered body by sintering the molded body in an oxygen atmosphere of 1500° C. or more and 1600° C. or less.

* * * * *